United States Patent
Venugopal et al.

(10) Patent No.: US 12,249,396 B2
(45) Date of Patent: Mar. 11, 2025

(54) FOLDING ORDERING SCHEME FOR IMPROVED THROUGHPUT IN NON-VOLATILE MEMORY

(71) Applicant: Western Digital Technologies, Inc., San Jose, CA (US)

(72) Inventors: Abhinandan Venugopal, Bengaluru (IN); Amit Sharma, Bengaluru (IN)

(73) Assignee: Sandisk Technologies, Inc., Milpitas, CA (US)

( * ) Notice: Subject to any disclaimer, the term of this patent is extended or adjusted under 35 U.S.C. 154(b) by 143 days.

(21) Appl. No.: 18/346,329

(22) Filed: Jul. 3, 2023

(65) Prior Publication Data
US 2024/0221802 A1 Jul. 4, 2024

Related U.S. Application Data

(60) Provisional application No. 63/478,209, filed on Jan. 3, 2023.

(51) Int. Cl.
*G11C 7/10* (2006.01)

(52) U.S. Cl.
CPC .......... *G11C 7/1096* (2013.01); *G11C 7/1069* (2013.01); *G11C 7/1087* (2013.01)

(58) Field of Classification Search
CPC ... G11C 7/1096; G11C 7/1069; G11C 7/1087; G11C 11/5628; G11C 11/5642; G11C 16/0483; G11C 16/10; G11C 7/1006
See application file for complete search history.

(56) References Cited

U.S. PATENT DOCUMENTS

| | | | |
|---|---|---|---|
| 8,027,195 B2 | 9/2011 | Li et al. | |
| 8,059,455 B2 | 11/2011 | Stern et al. | |
| 8,154,918 B2 | 4/2012 | Sharon et al. | |
| 8,301,912 B2 | 10/2012 | Lin et al. | |
| 8,429,330 B2 | 4/2013 | Wan et al. | |
| 8,468,294 B2 | 6/2013 | Huang et al. | |
| 8,843,693 B2 | 9/2014 | Hsu et al. | |
| 9,569,143 B1 | 2/2017 | Sehgal et al. | |
| 9,858,009 B2 | 1/2018 | Bhalerao et al. | |
| 2015/0220385 A1 | 8/2015 | Wood et al. | |
| 2018/0217751 A1* | 8/2018 | Agarwal | G11C 16/3495 |

* cited by examiner

*Primary Examiner* — Xiaochun L Chen
(74) *Attorney, Agent, or Firm* — Pearl Cohen Zedek Latzer Baratz LLP

(57) ABSTRACT

In a non-volatile memory system that initially writes data in a binary format and then folds the stored data into a multi-level format, transfers of host data from the memory controller to the memory dies of the system are performed during both foggy and fine phases of the multi-level programming as data latches are released, allowing the transfer times to be hidden behind the programming. To improve data throughput one sub-set of the memory dies perform their foggy phase programming while another sub-set of the memory dies perform their fine phase programming, resulting in non-overlapping transfer windows for host data transfers for the two sub-sets of memory dies.

20 Claims, 28 Drawing Sheets

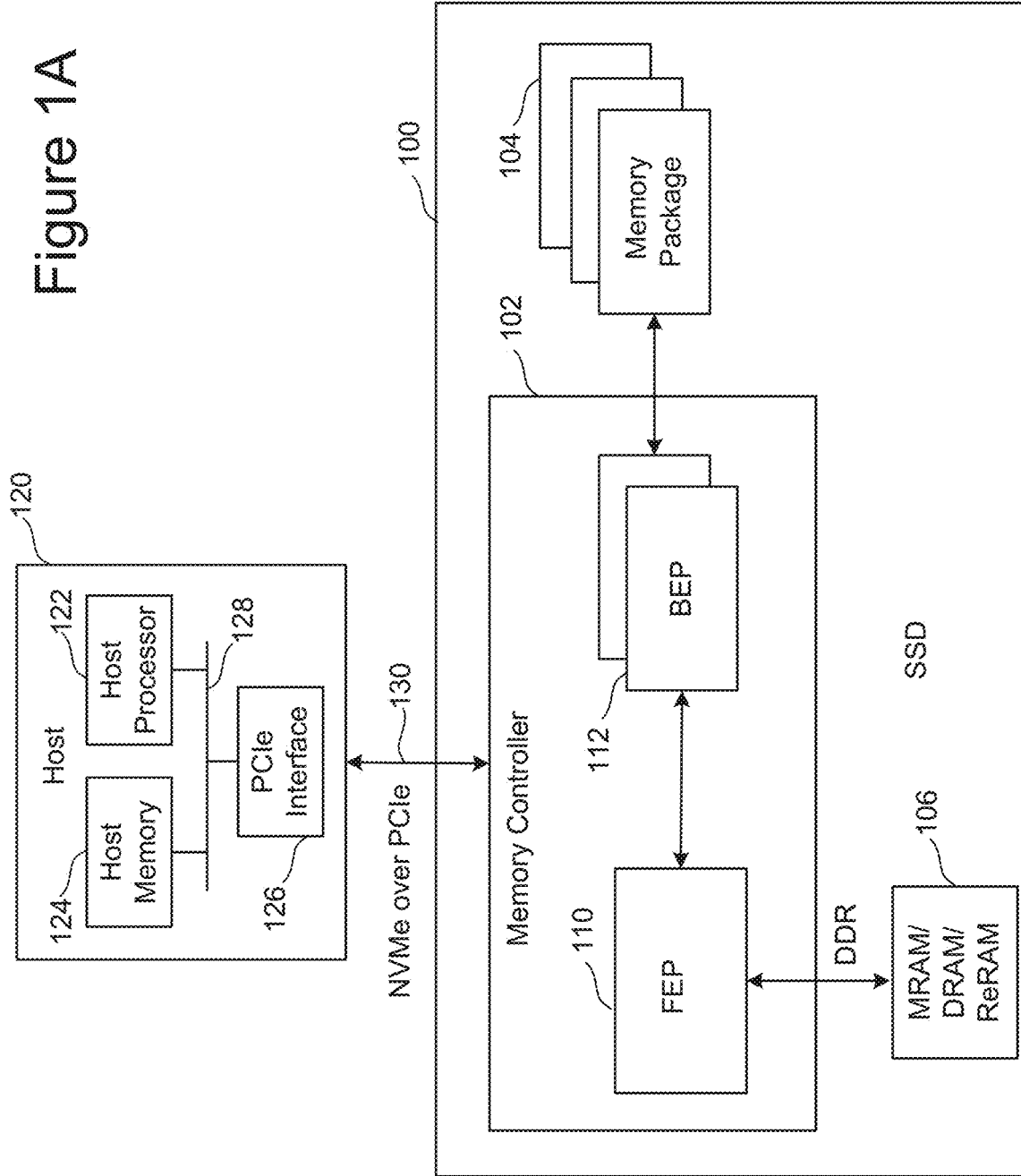

Figure 7A
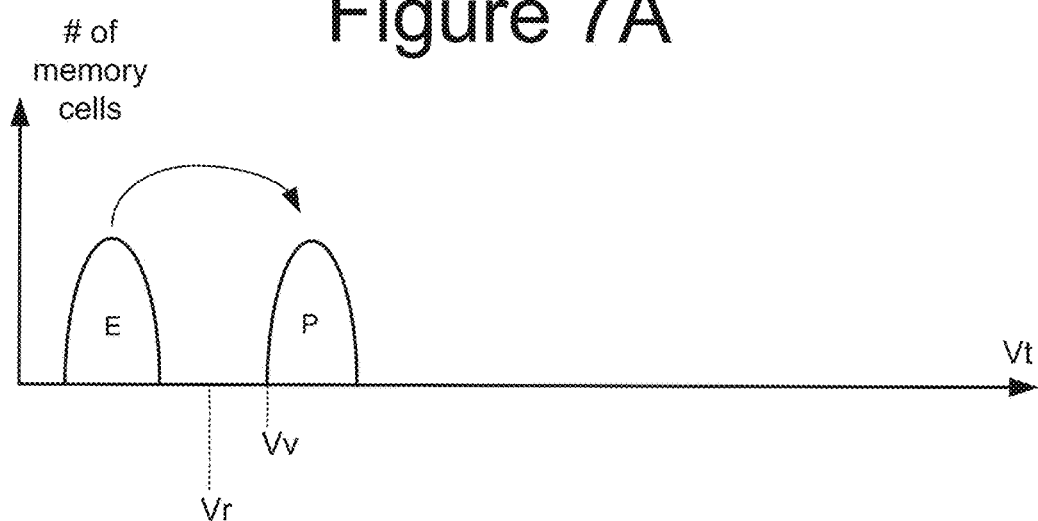
Figure 7B
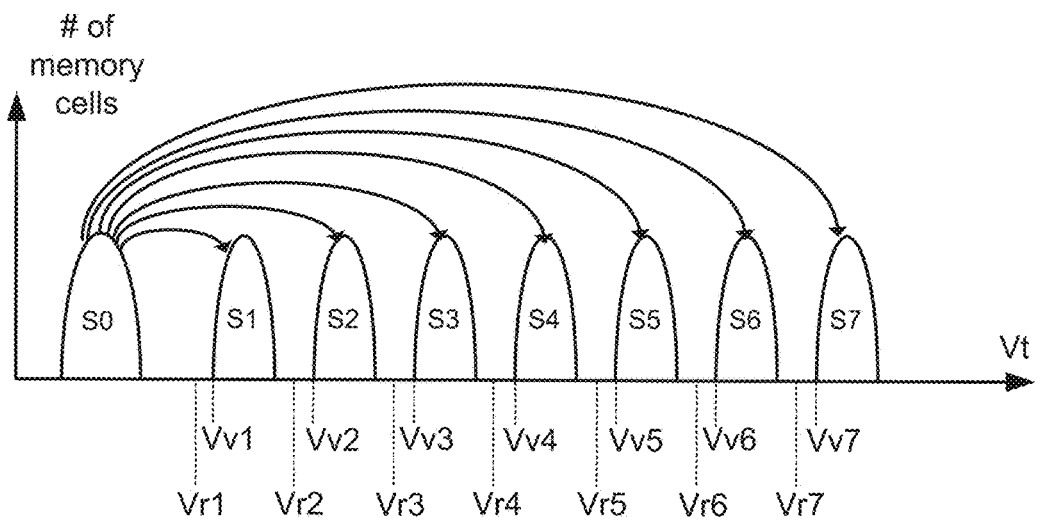
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

| WL | STAGE | STR0 | STR1 | STR2 | STR3 |
|---|---|---|---|---|---|
| 127 | FINE | 1020 | 1021 | 1022 | 1023 |
|  | FOGGY | 1012 | 1014 | 1016 | 1018 |
| 126 | FINE | 1013 | 1015 | 1017 | 1019 |
|  | FOGGY | 1004 | 1006 | 1008 | 1010 |
| ... |  |  |  |  |  |
| 3 | FINE | 29 | 31 | 33 | 35 |
|  | FOGGY | 20 | 22 | 24 | 26 |
| 2 | FINE | 21 | 23 | 25 | 27 |
|  | FOGGY | 12 | 14 | 16 | 18 |
| 1 | FINE | 13 | 15 | 17 | 19 |
|  | FOGGY | 4 | 6 | 8 | 10 |
|  | FINE | 5 | 7 | 9 | 11 |
| 0 | FOGGY | 0 | 1 | 2 | 3 |

Figure 16

FOLDING ORDERING SCHEME FOR IMPROVED THROUGHPUT IN NON-VOLATILE MEMORY

CLAIM OF PRIORITY

The present application claims priority from U.S. Provisional Patent Application No. 63/478,209, entitled "FOLDING ORDERING SCHEME FOR IMPROVED THROUGHPUT IN NON-VOLATILE MEMORY," by Venugopal et al., filed Jan. 3, 2023, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture, which comprises a stack of alternating conductive and dielectric layers.

A memory device includes memory cells that may be arranged in series, in NAND strings, for instance, where select gate transistors are provided at the ends of the NAND string to selectively connect a channel of the NAND string to a source line or bit line. However, various challenges are presented in operating such memory devices.

In some memory structures (e.g., NAND structures) that use charge-storing or charge-trapping material, programming of memory cells may disturb previously-programmed memory cells (e.g., charge added to a memory cell may affect nearby memory cells). To mitigate such program disturb effects, programming may occur in two or more program operations, with neighboring memory cells programmed (at least partially) between program operations. While this approach may mitigate program disturb effects, implementation may require significant data storage capacity to maintain data between program operations (e.g., before data is fully programmed in a NAND structure) and may incur significant overhead (e.g., significant movement of data between components for multiple program operations). Efficiently programming memory cells in multiple program operations may be challenging.

An important measure of a memory device is the amount of data that it can store. The data capacity of a NAND memory die can be increased by having more memory cells, such as can be achieved by smaller memory cell size and 3D memory architectures, and by storing more data per memory cell by use of multi-level cells that can each store multiple bits of data. Although multi-level memory cells can increase memory densities, writing data to the memory cells in a multi-level format is a complicated operation and becomes increasingly so as the number bits stored in each memory cell increases.

Another important measure of a memory device is the speed at which it can receive and store host data. Being able to meet write speed requirements becomes increasingly difficult as memories move to multi-level cell memories as the increased numbers of bits written to each memory cell results in longer programming times due the increased complexity of the write operation. To meet the competing demands of write speed and storage density, host data can initially be written into memory using a high write speed, but low density, binary format to cache the host data, and later rewriting the data into a high density, but low write speed multi-state format. However, this approach can again cause limitations on the throughput of host data since, to maintain a sufficient number of memory blocks available for binary writing of host data, a balance needs to be maintained between the receiving and binary writing of host data and the later rewriting of this data into a multi-state format to free up the binary memory blocks for further transfers.

BRIEF DESCRIPTION OF THE DRAWINGS

FIG. 1A is a block diagram of one embodiment of a storage system connected to a host.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

FIG. 16 shows an example of a programming scheme that may be used to program word lines of four fingers of a 3D NAND structure.

DETAILED DESCRIPTION

Figure 1B:
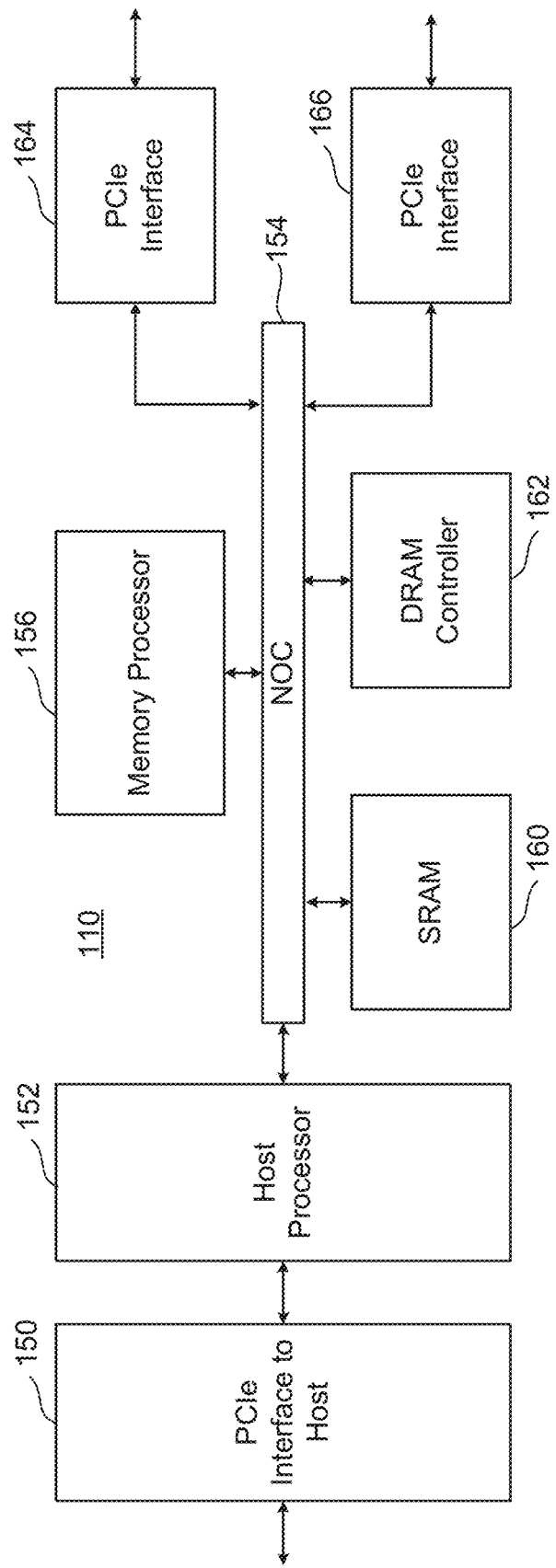
FIG. 1B is a block diagram of one embodiment of a Front End Processor Circuit.

Apparatuses and techniques are described for programming non-volatile memory cells, such as non-volatile memory cells in a NAND or other multi-level cell (MLC) memory structure. To maintain write rates for memory devices such as solid state drives (SSDs), data is initially written in a binary, or single level cell (SLC), format, as binary programming can be performed more quickly than MLC programming. To increase storage densities, and free up SLC blocks of memory for subsequent host data writes, the host data written in SLC format is subsequently rewritten into an MLC format in a "folding" operation. To reduce program disturbs during the folding operation, the MLC programming can use a two stage (e.g., foggy-fine) programming operation. To maintain high rates of throughput for host data, while maintaining sufficient availability of SLC bocks, the transfers of host data from the non-volatile memory controller to the memory dies can be interspersed with the folding operations. In the folding operation, multiple pages of host data are read out of SLC memory into data latches for reprogramming in MLC format, with the latches being sequentially released as the MLC programming progresses. As the latches are released, transfers of host data can be made to the freed latches will MLC programming continues, thereby hiding some of these host data transfer times.

To increase parallelism, non-volatile memory controllers can manage a set of memory dies in parallel, where the standard way for performing the folding operations on the set of dies is for all dies of the set to perform the initial (i.e., foggy) MCL programming phase at the same time and to all perform the final (i.e., fine) MCL programming phase at the same time. However, this arrangement may leave insufficient windows of time for maintaining host data transfer writes while hiding these controller-to-die transfers behind the MLC programming operations. To address this issue, techniques presented below allow for one sub-set of the memory dies to perform their initial phase programming while another sub-set of the memory dies perform their fine phase programming, resulting in non-overlapping transfer windows for host data transfers for the two sub-sets of memory dics.

FIGS. 1A-6F describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
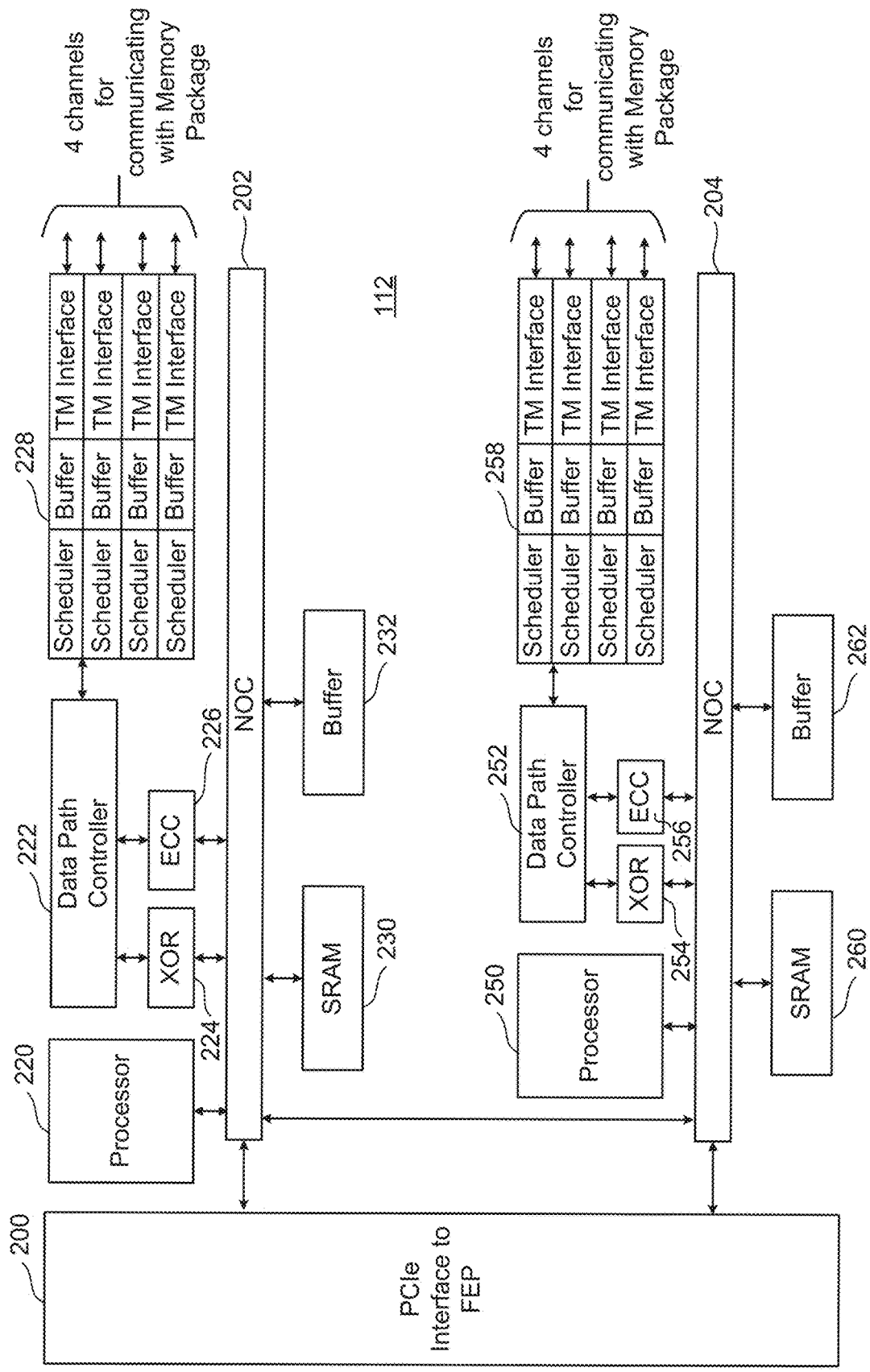
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
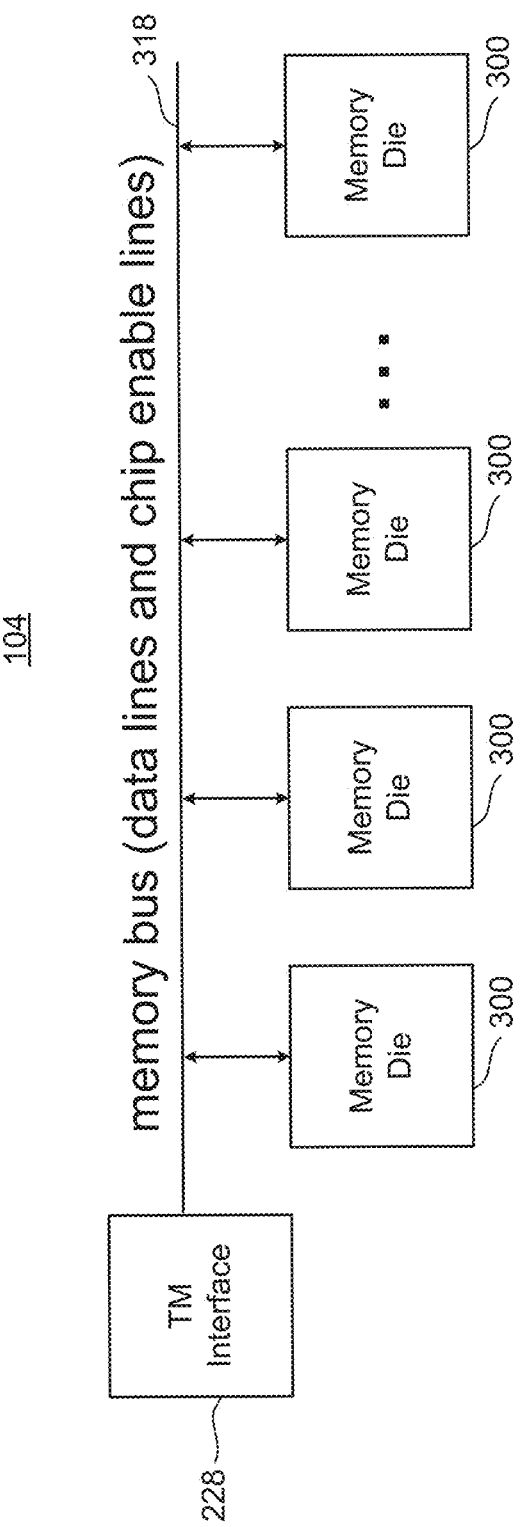
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
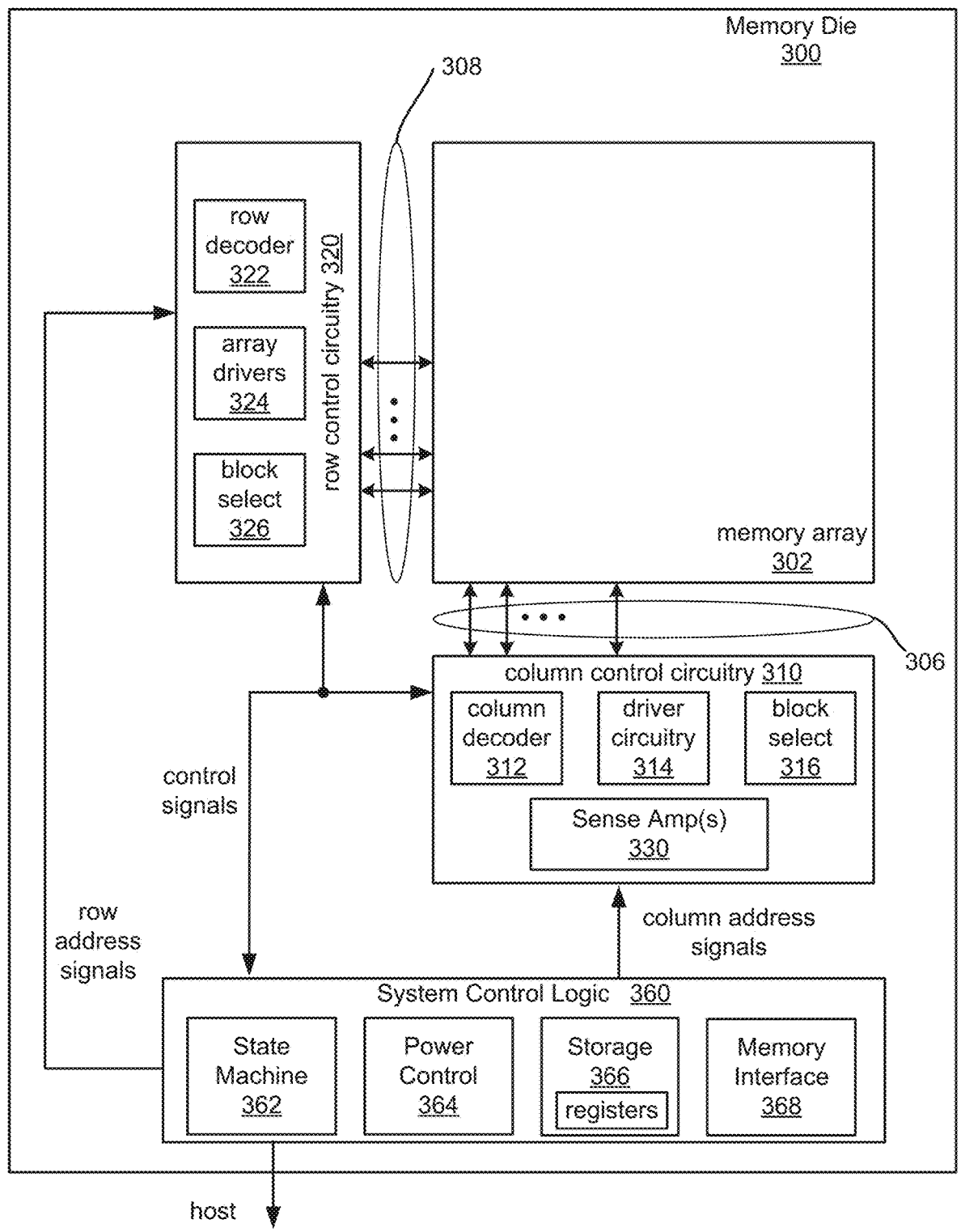
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
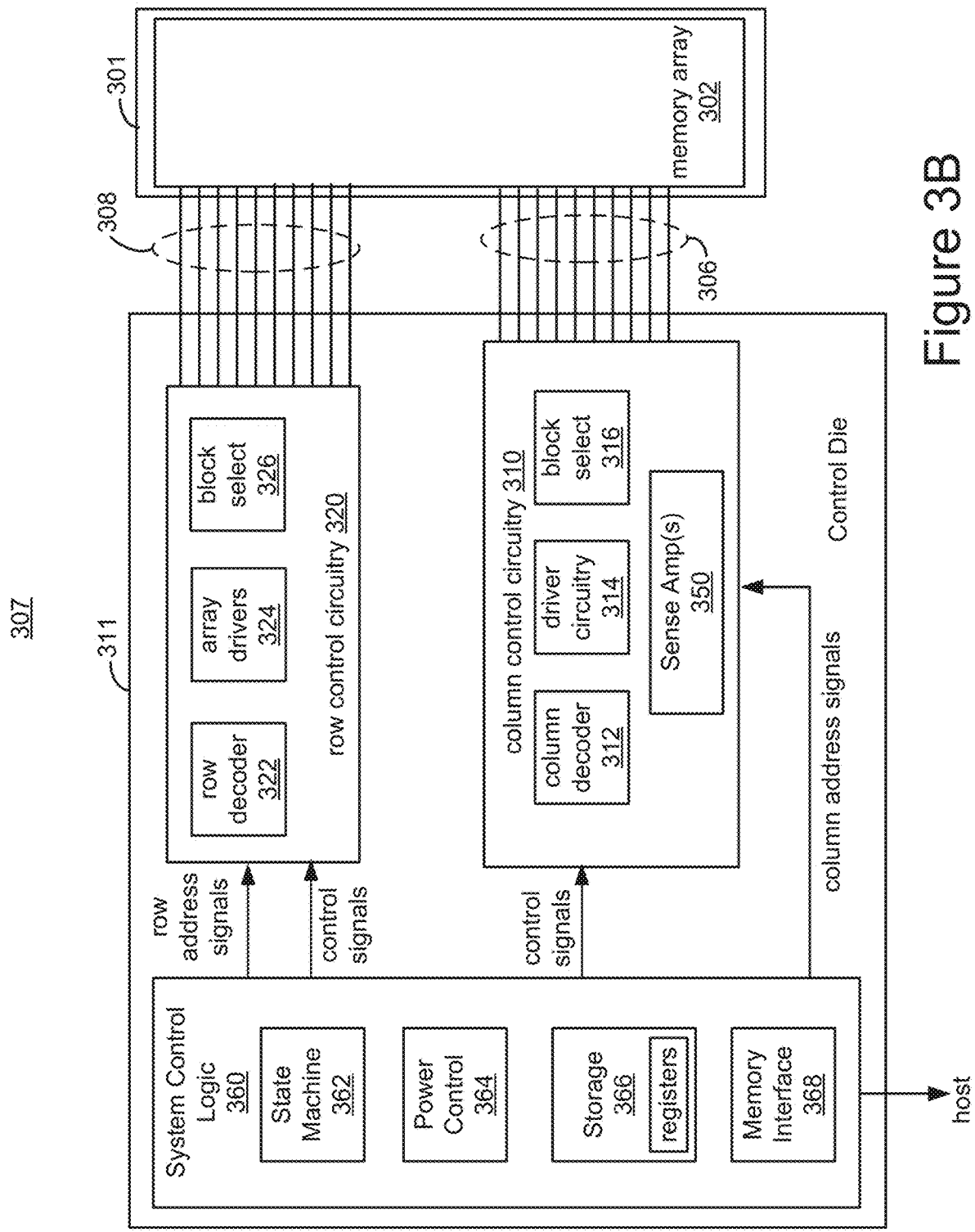
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 4:
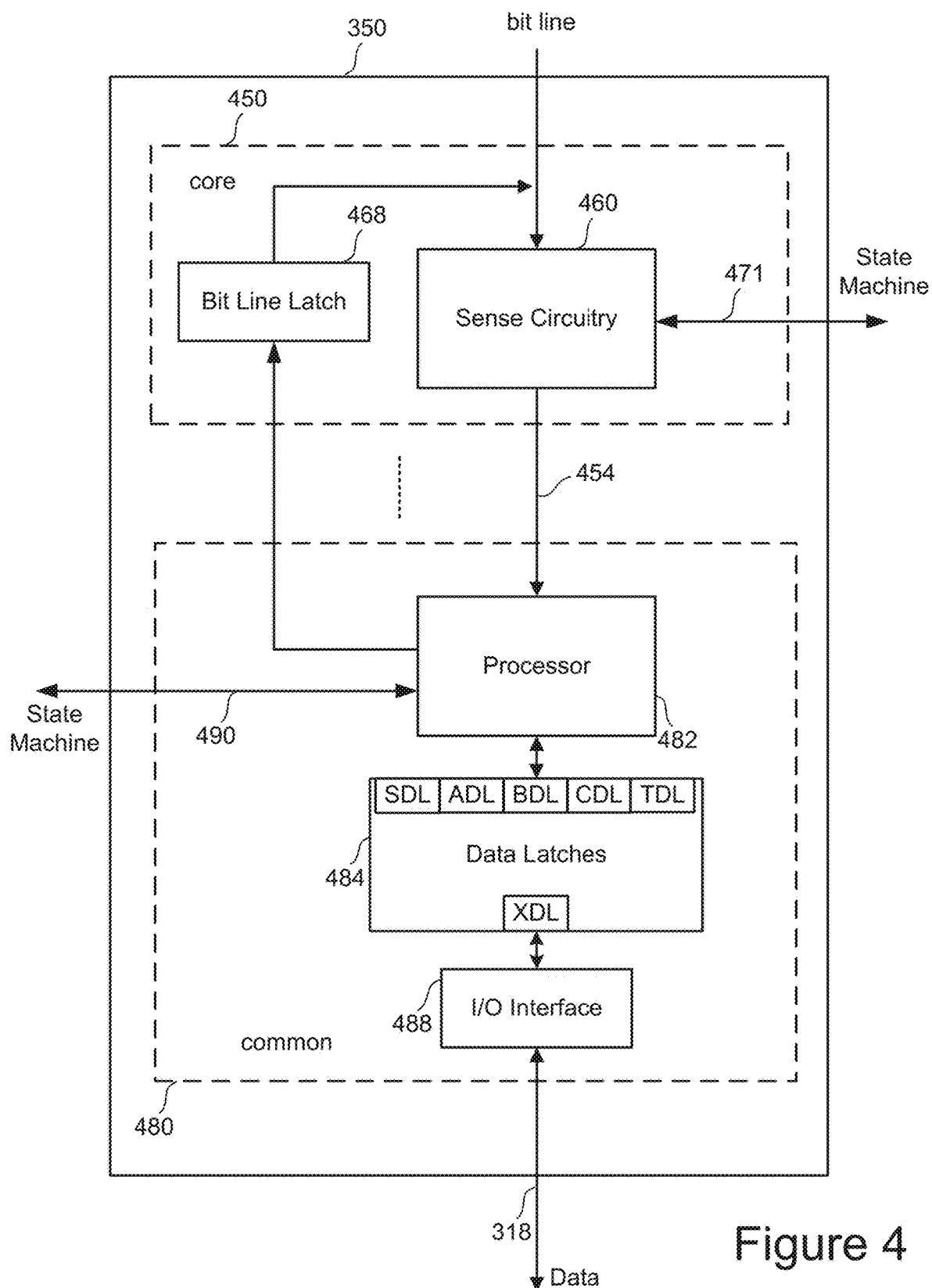
FIG. 4 is a block diagram of an individual sense block partitioned into a core portion and a common portion.

FIG. 4 is a block diagram of an individual sense block of sense amplifiers 350 partitioned into a core portion, referred to as a sense module 480, and a common portion 480. In one embodiment, there will be a separate sense module 450 for each bit line and one common portion 480 for a set of multiple sense modules 450. In one example, a sense block will include one common portion 480 and eight sense, twelve, or sixteen modules 450. Each of the sense modules in a group will communicate with the associated common portion via a data bus 454.

Sense module 450 comprises sense circuitry 460 that determines whether a conduction current in a connected bit line is above or below a predetermined level or, in voltage based sensing, whether a voltage level in a connected bit line is above or below a predetermined level. The sense circuitry 460 is to received control signals from the state machine via input lines 471. In some embodiments, sense module 450 includes a circuit commonly referred to as a sense amplifier. Sense module 450 also includes a bit line latch 468 that is used to set a voltage condition on the connected bit line. For example, a predetermined state latched in bit line latch 468 will result in the connected bit line being pulled to a state designating program inhibit (e.g., Vdd).

Common portion 480 comprises a processor 468, a set of data latches 484 and an I/O Interface 488 coupled between the set of data latches 484 and data bus 318. Processor 468 performs computations. For example, one of its functions is to determine the data stored in the sensed memory cell and store the determined data in the set of data latches. The set of data latches 484 is used to store data bits determined by processor 468 during a read operation. It is also used to store data bits imported from the data bus 318 during a program operation. The imported data bits represent write data meant to be programmed into the memory. I/O interface 488 provides an interface between data latches 484 and the data bus 318.

During read or sensing, the operation of the system is under the control of state machine 362 that controls (using power control 364) the supply of different control gate or other bias voltages to the addressed memory cell(s). As it steps through the various predefined control gate voltages corresponding to the various memory states supported by the memory, the sense module 450 may trip at one of these voltages and an output will be provided from sense module 450 to processor 482 via bus 454. At that point, processor 482 determines the resultant memory state by consideration of the tripping event(s) of the sense module and the information about the applied control gate voltage from the state machine via input lines 490. It then computes a binary encoding for the memory state and stores the resultant data bits into data latches 484. In another embodiment of the core portion, bit line latch 468 serves double duty, both as a latch for latching the output of the sense module 450 and also as a bit line latch as described above.

Data latch stack 484 contains a stack of data latches corresponding to the sense module. In one embodiment, there are three, four or another number of data latches per sense module 450. In one embodiment, the latches are each one bit. In this document, the latches in one embodiment of data latch stack 484 will be referred to as SDL, XDL, ADL, BDL, and CDL. In the embodiments discussed here, the latch XDL is a transfer latch used to exchange data with the I/O interface 488. In addition to a first sense amp data latch SDL, the additional latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. In other embodiments, the XDL latches can be used to hold additional pages of data. such as a 4-bit per cell MLC embodiment the uses the XDL latches in addition to the three sets of latches ADL, BDL, CDL for four pages of data. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 484 from the data bus 318. During the verify process, processor 482 monitors the verified memory state relative to the desired memory state. When the two are in agreement, processor 482 sets the bit line latch 468 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 318, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5A:
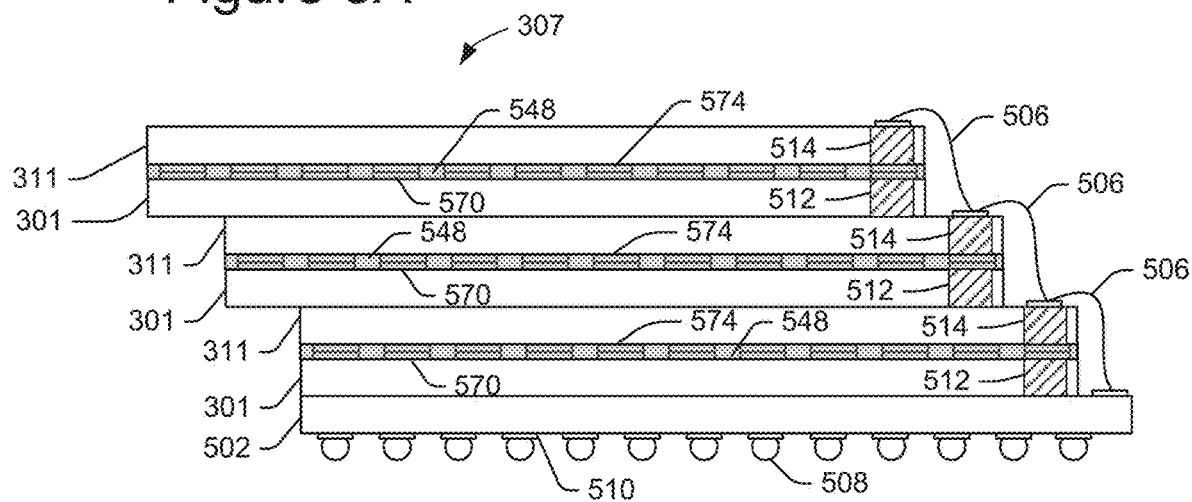
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
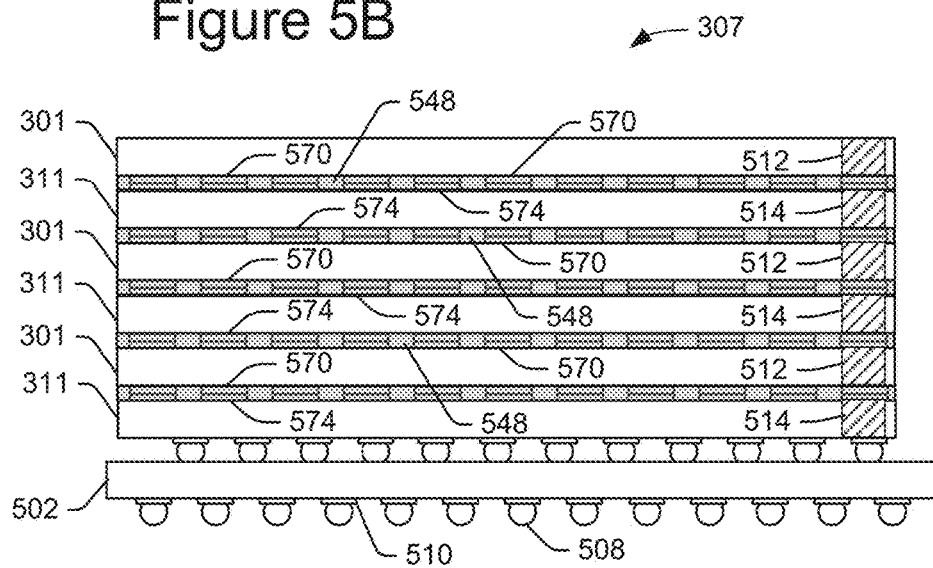
FIG. 5B depicts a side view of an embodiment of an integrated memory assembly stacked on a substrate.

FIG. 5B depicts a side view of an embodiment of an integrated memory assembly 307 stacked on a substrate 502. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
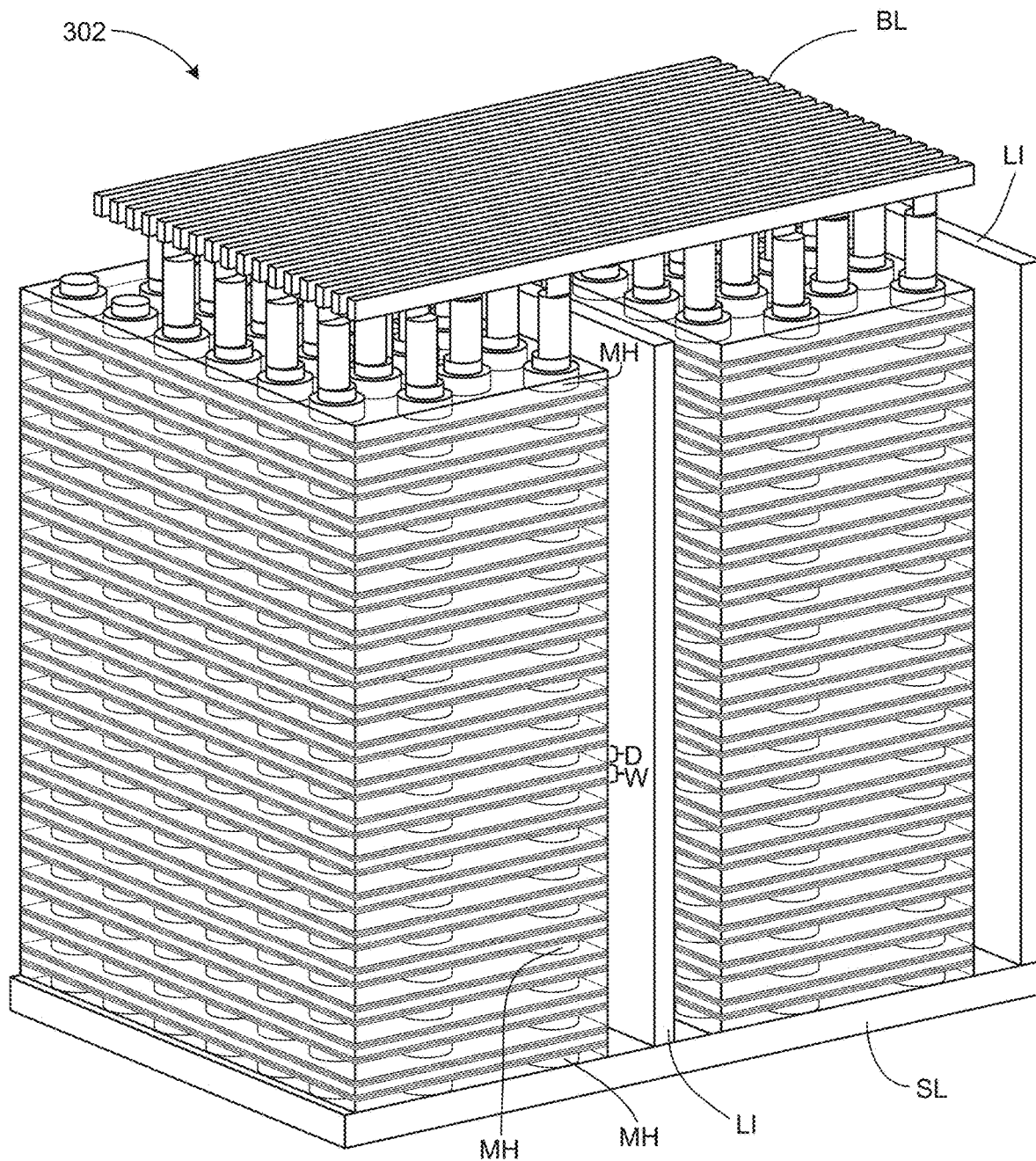
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 6B:
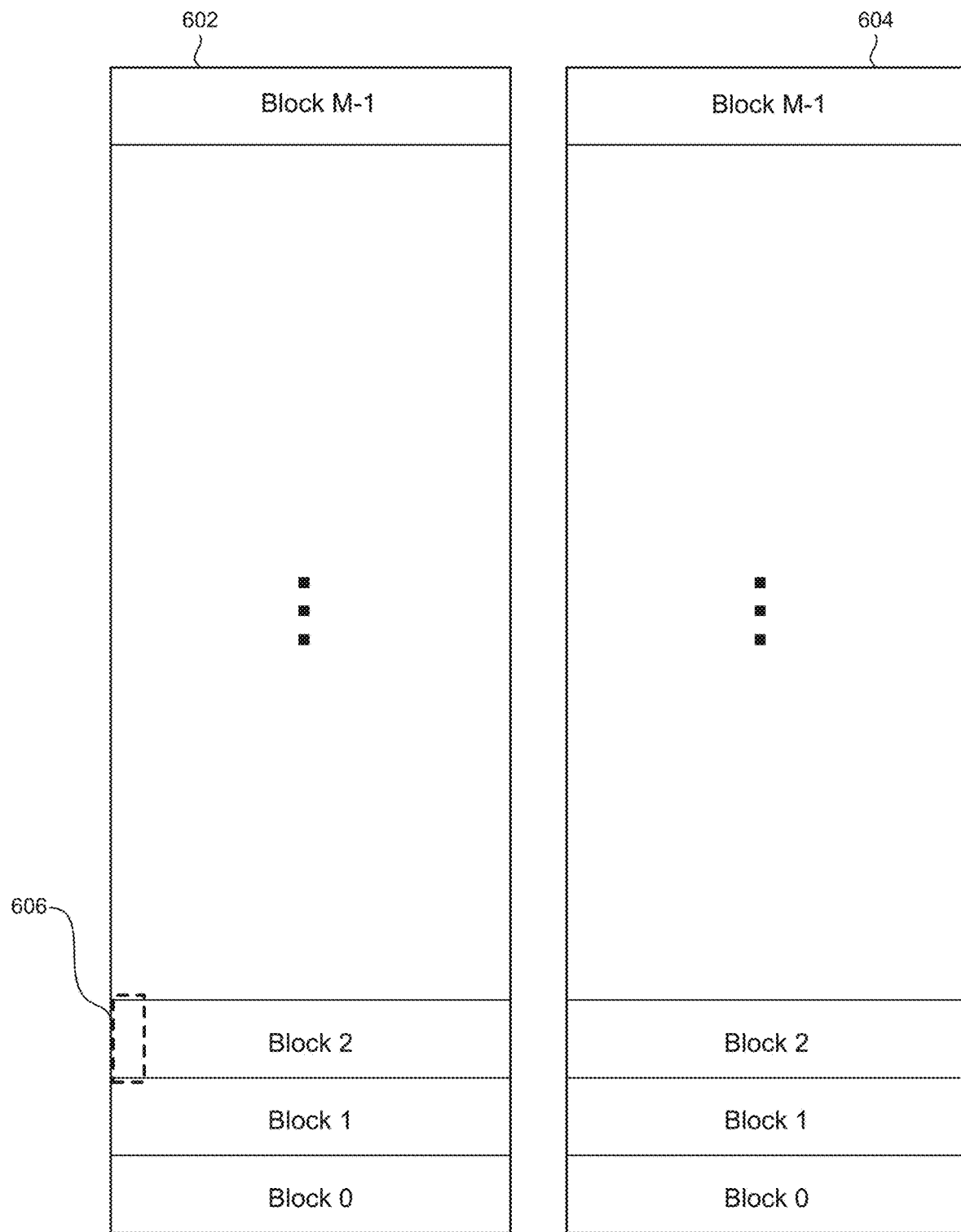
FIG. 6B is a block diagram explaining one example organization of memory structure.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
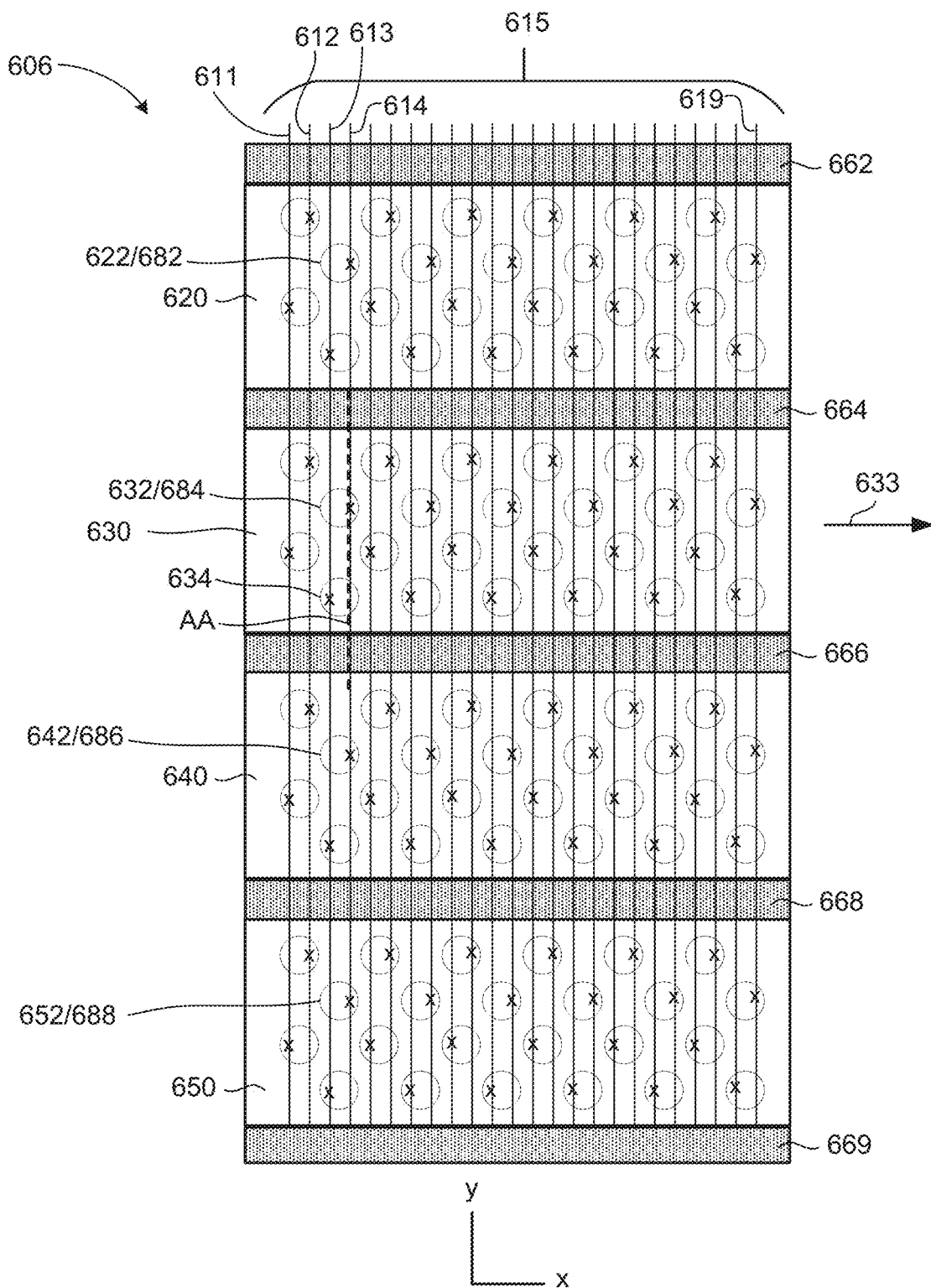
FIG. 6C is a block diagram depicting a top view of a portion of one block from the memory structure.
Figure 6D:
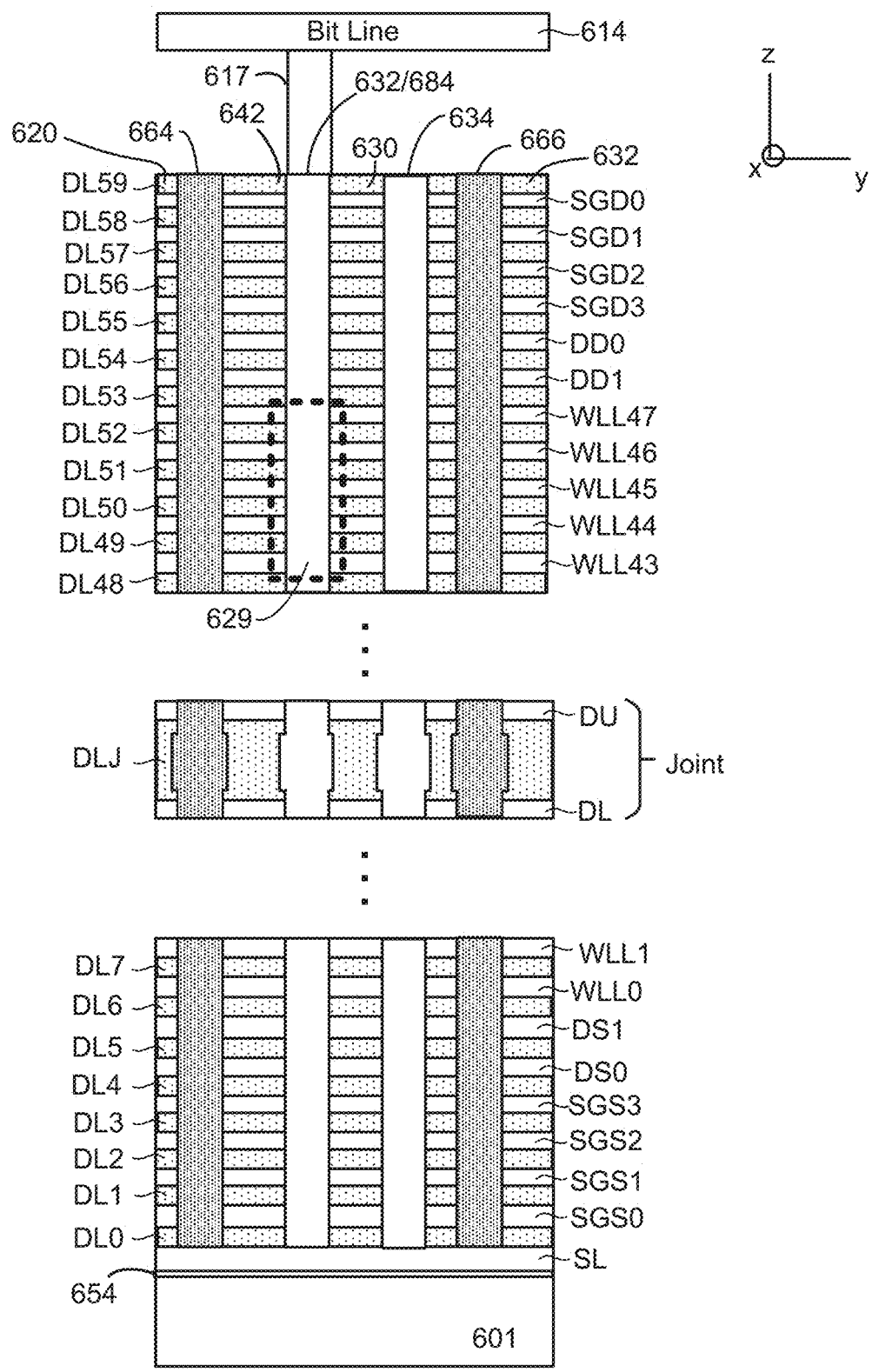
FIG. 6D depicts a portion of an embodiment of three dimensional memory structure showing a cross-sectional view along line AA of FIG. 6C.
Figure 6E:
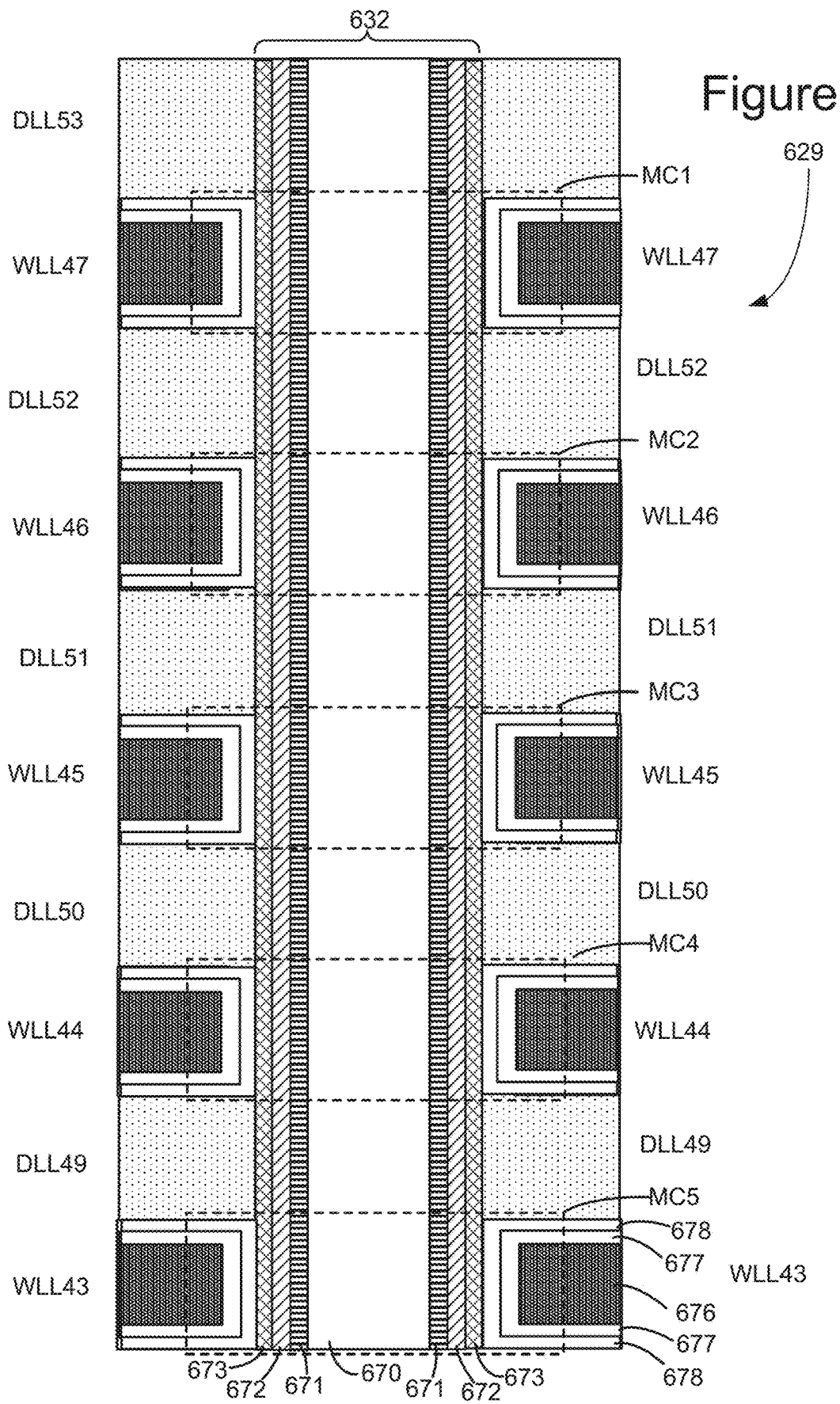
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns include multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . , 619. FIG. 6C shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together). Therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes: four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or fewer than four drain side select layers, more or fewer than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

For three dimensional NAND memory arrays having large numbers of word lines, one or more joint regions may be included. The use of a joint can simply the fabrication process and, in some embodiments, allow for sub-block level operations by accessing word lines only above or below the joint. The joint region will often have thicker dielectric region DLJ than between other word lines. As with the source and drain ends, one or more dummy word lines may be included above (DU) and below (DL) the joint.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($SiO_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
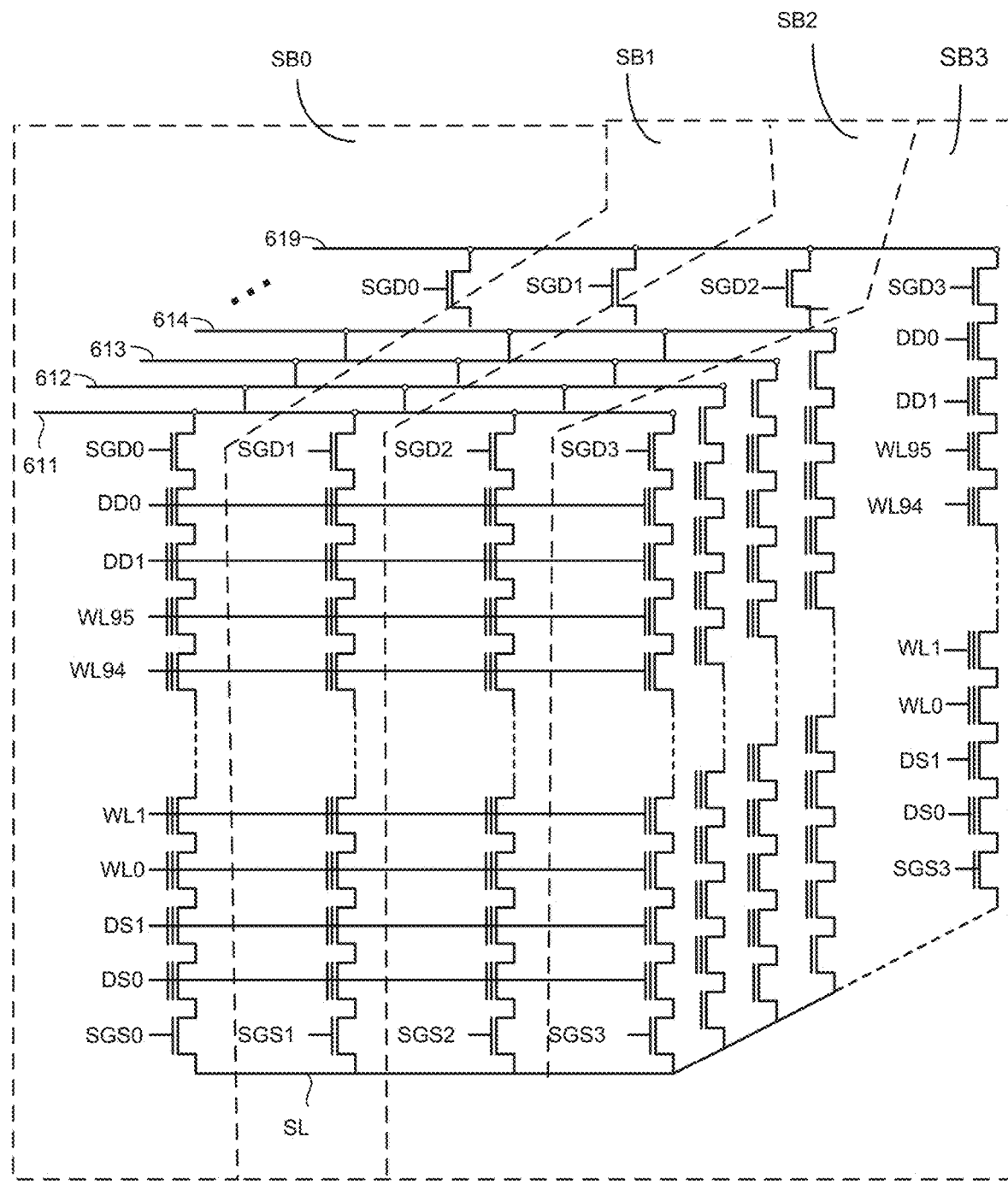
FIG. 6F is a schematic of a plurality of NAND strings showing multiple sub-blocks.

FIG. 6F is a schematic diagram of a portion of the memory depicted in in FIGS. 6A-6E. FIG. 6F shows physical word lines WLL0-WLL95 running across the entire block. The structure of FIG. 6F corresponds to portion 606 in Block 2 of FIGS. 6A-6E, including bit lines 611, 612, 613, 614, . . . , 619. Within the block, each bit line is connected to four NAND strings. Drain side selection lines SGD0, SGD1. SGD2 and SGD3 are used to determine which of the four NAND strings connect to the associated bit line(s). Source side selection lines SGS0, SGS1. SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures (e.g., MRAM, ReRAM, PCM) can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. Referring back to FIG. 4, in one embodiment the ADL, BDL, and CDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2. Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
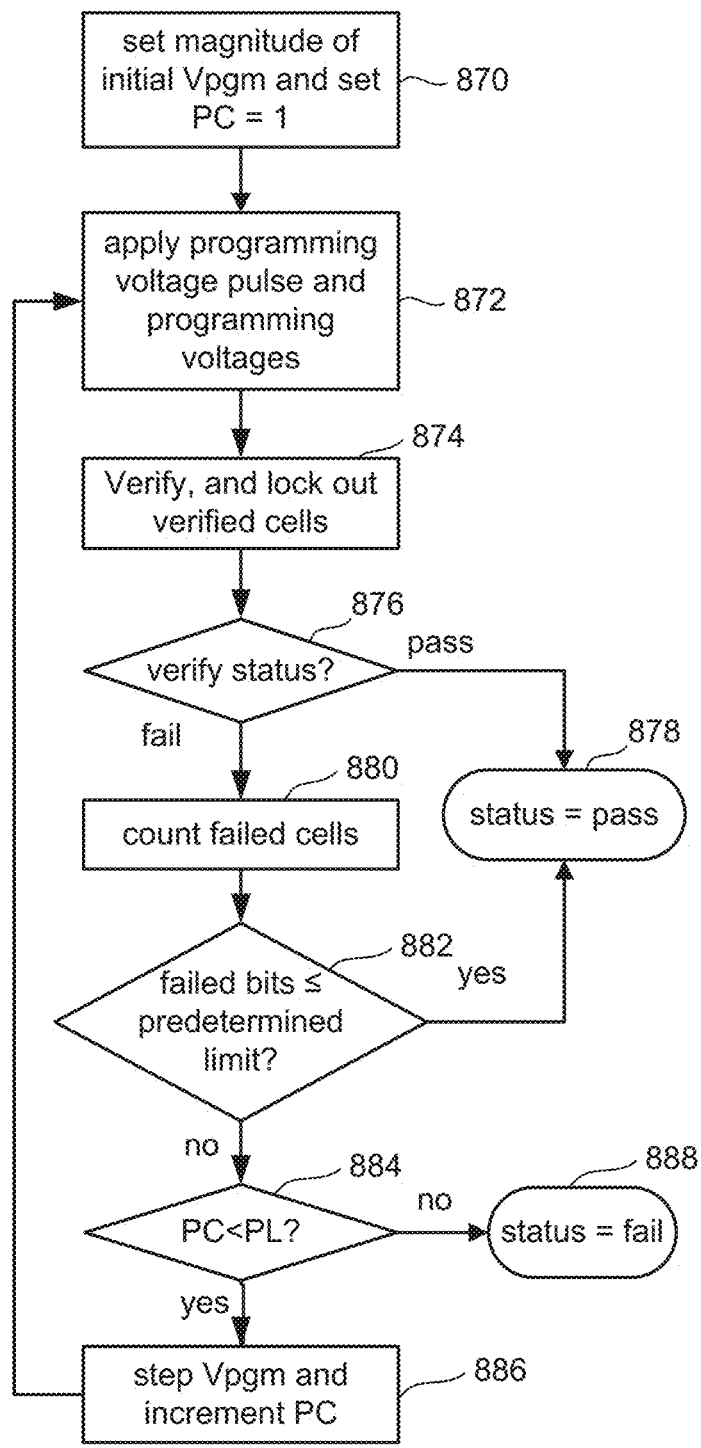
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
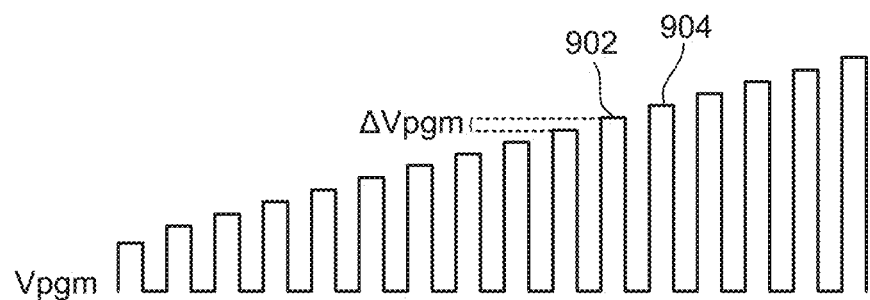
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16V or another suitable level) and a program counter PC maintained by state machine 362 is initialized at 1. In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells were programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
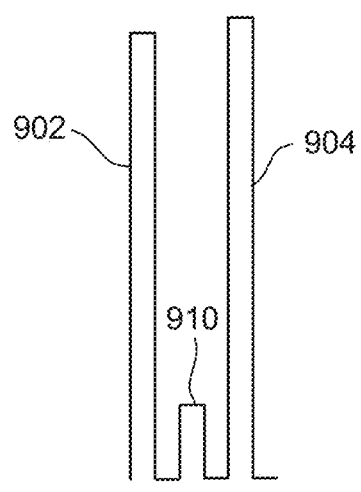
FIG. 10 depicts two programming voltage pulses and a verify voltage pulse.
Figure 11:
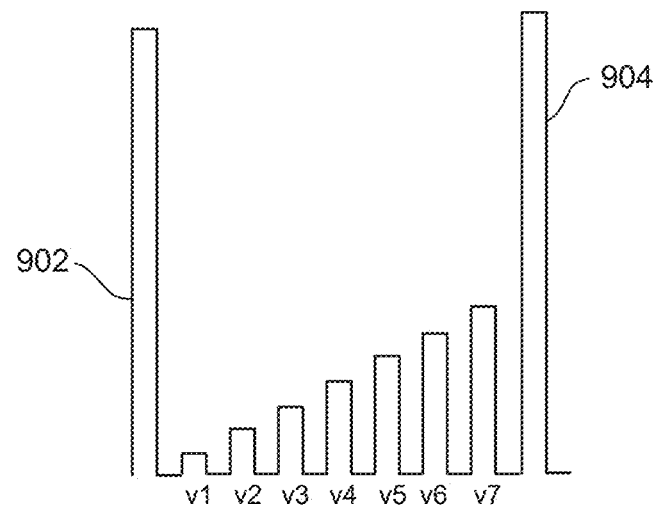
FIG. 11 depicts two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2, v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

With improvements in NAND packing density (i.e., the number of bits stored per memory cell), more voltage states need to be managed in given voltage range. In 3-states per cell, seven program states needs to be managed and in 4-states per cell, this has increased to fifteen states. As state-to-state gaps narrows, programming needs to be increasingly precise. As a result, program times for 4- or 5-states per cell will be longer compared to 3-state per cell embodiments. However, performance requirements of products need to be met. In such scenarios, faster binary, or SLC (single level cell) blocks of NAND memory can be used temporarily as buffers to hold host data. This compensates the host speed requirement by buffering data by writing it in an SLC format, then moving later to a high density multi-level cell (MLC) format, such as in 4- or 5-states per cell formats. Such scheme is called "folding".

Figure 12:
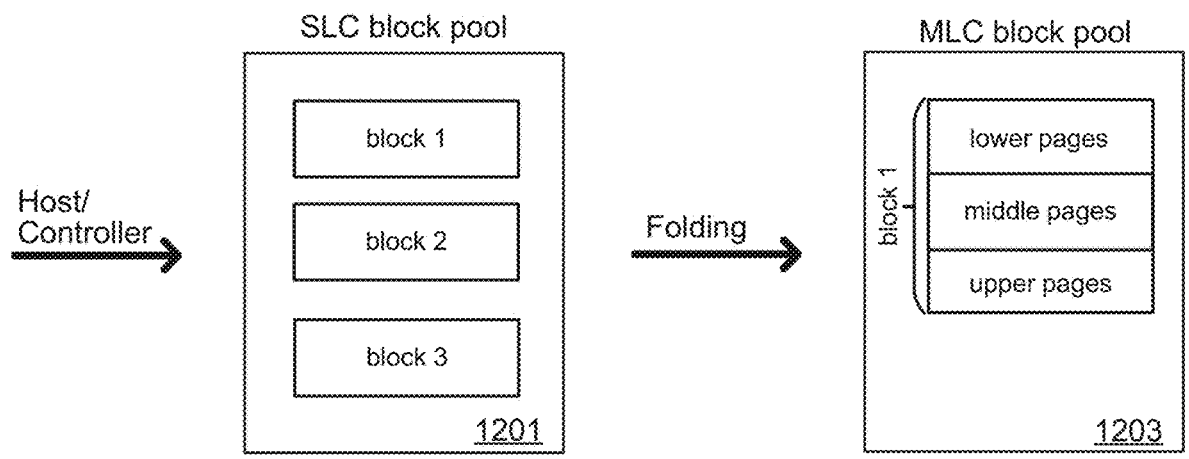
FIG. 12 illustrates the concept of folding at the block pool level.
Figure 13:
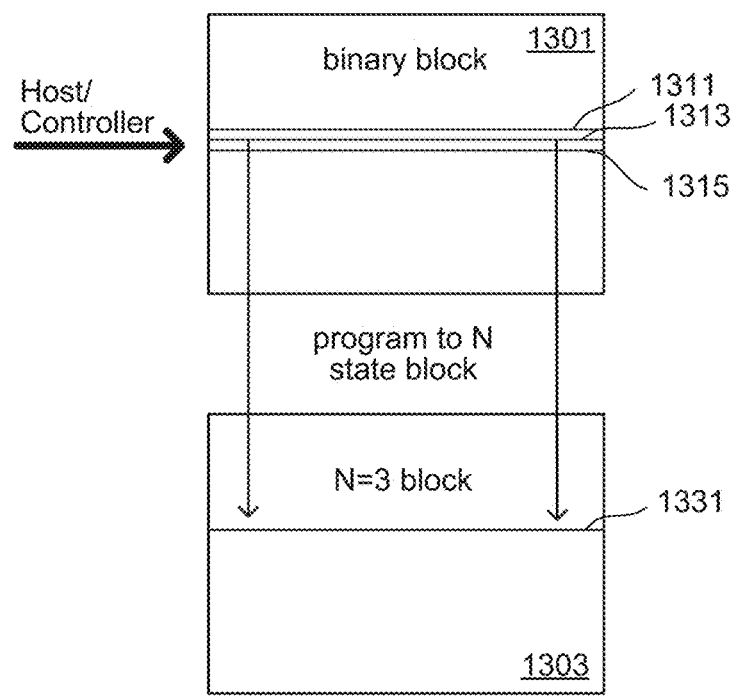
FIG. 13 illustrates the idea of folding data from a binary to a N-state format for a 3-bit per cell example when the binary SLC block and the MLC block are on the same plane.
Figure 14:
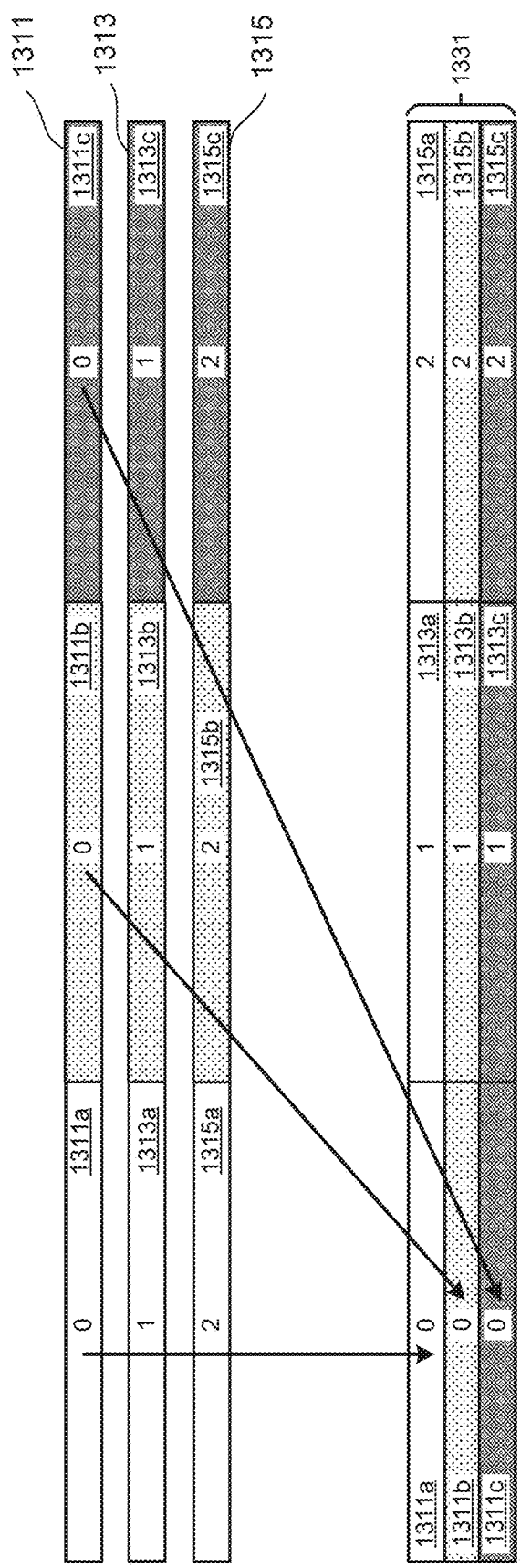
FIG. 14 illustrates an embodiment for an embodiment of how the multiple SLC word lines can be folded into a single MLC word line.

FIG. 12 illustrates the concept of folding at the block pool level for 3-bit per cell example. To deal with the competing demands of fast writes of host data and high storage capacity, a non-volatile memory can initially store data received from a host in a binary, or SLC, format to take advantage of binary memory's relatively fast programing and then, at a later time, rewrite the data into a high density MLC format. For this purpose, some number of memory blocks are assigned for storing data in an SLC format and others are assigned for storing data in an MLC format. These blocks are maintained as pools available for programming and the division into SLC and MLC blocks can be static or dynamic, based on the embodiment. As data comes in from a host or controller, to maintain write speed requirements, available blocks from the MLC pool 1201 are selected are the data is written in a number of blocks. In an N-bit per cell MLC embodiment, where FIG. 12 illustrates an N=3 example, at some time later N binary blocks can be folded into one N-bit per cell block from the MLC pool 1203. Depending on the embodiment, the SLC blocks and the MLC blocks can be from different dies, form different planes of the same die, or different blocks of the same plane. If the blocks are from different dies, this allows for more flexibility, but requires transfer over the memory bus structure. Different planes of the same die can reduce bus traffic, but requires transfers between the differing planes' sets of latches. When the SLC and MLC blocks are within the same plane of a die, after the host data is written in SLC format it can be read out into the plane's data latches and then reprogrammed into an MLC block of the same plane without having to transfer the data out of the plane's peripheral circuitry. FIGS. 13 and 14 consider embodiments for folding in more detail.

FIG. 13 illustrates the idea of folding data from a binary to a N-state format for a 3-bit per cell example when the binary SLC block and the MLC block are on the same plane. As shown by the arrow, data is received from the controller (or host) and written in binary format in a block 1301 of the memory. Three of the written word lines (1311, 1313, 1315) of the block 1301 are explicitly shown. Subsequently, the data is then read into the data latches 484 associated with the array, where it is rearranged so that it can be written back into array in a multi-state form. To take the case of three bits per cell, for example, the content of three word lines (1311, 1313, 1315) would be each be read into the register structures, rearranged to correspond to the three bits that would be stored in each cell, and then rewritten back to a single word line of the array in a 3-bit per cell format. In the arrangement described here, the binary data content of a single word line is then end up on 1/Nth of a word line store in an N-bit per cell format. The content of these three word lines (1311, 1313, 1315) are then rewritten in a 3-bit per cell format along the single word line 1331 of MLC block 1303, with the "folding" process accomplished on the memory itself. More generally, if the data is written along 1331 in an N-bit per cell format, the content of N-word lines of binary content would be folded up in this manner. This block 1301 may be specifically assigned to be operated in only binary mode or may be a block operable in an MLC mode by, for example, just writing the lowest page of multiple logical pages storable on a physical page. Similarly, block 1303 may be assigned only for multi-state operation or may be operable in binary mode as well.

FIG. 14 illustrates an embodiment for an embodiment on how the multiple SLC word lines can be folded into a single MLC word line. At the top of FIG. 14 are the three word lines 1311, 1313, and 1315, which are each split into three parts (a, b, c) of a third of the cells along a corresponding third of the bit lines (here taken as contiguous), where the part is without stippling, the b part has light stippling, and the c part has heavy stippling. On word line 1331, the three thirds of the first word line (1311a-c) are arranged onto to first third of the of the word line; similarly, the second binary word line 1313 is folded and written into the middle third of 1331 and the third word line 1315 from the binary block 1301 is written into the last third of 1331. The process shown in FIG. 14 generalizes in a number of ways. A first of these is in the number of states stored per cell in the multi-state format. Although FIGS. 12-14 show the case where three pages of data are rewritten from three physical pages into multi-state format on a single physical page, other numbers of storage densities can be used. Also, although fall word lines (each here corresponding to a page) are shown, in systems that allow partial page operation, partial pages may be used. Additionally, although FIG. 14 shows the case where memory cells along the word line are split into groups along contiguous bit lines for folding, other arrangements can be used. As noted above, the folding process can be performed on the memory die itself, so that once the data is transferred in from the controller (or host) and written in binary format, it is rewritten into the array without transferring it off the memory. The example embodiments accomplish this by reading the data of the multiple binary word lines (e.g., 1311, 1313, 1315) into the corresponding registers (or latches 484) associated with the array, rearranged within these registers into the form needed for multi-state programming, and then rewritten into a single word line (e.g., 1331) of a multi-state block. Thus, under the arrangement of FIG. 14, the binary content of several (here 3) memory cells on the same word line, but along different bit lines, are read into the associated data registers, and then rearranged to correspond to the multi-bits of a single cell on a corresponding single bit line, from where it can be written.

In the examples of FIGS. 7A-11, programming may be performed in a single continuous operation starting with all memory cells in the erased distribution (Er or S0) and ending with all or substantially all memory cells verified as being in their target distributions according to data to be stored. In other examples, programming to the states illustrated in FIGS. 7A-11 may occur in two or more separate programming operations that may be performed at different times. Other operations may be performed between such programming operations.

In some cases, programming of one or more memory cells may affect threshold voltage distributions of previously programmed memory cells. For example, programmed memory cells along a word line of a NAND structure may be affected by programming of subsequent word lines of the NAND structure (e.g., programming of memory cells along an adjacent word line in the same block). When charge is added to nearby memory cells, the threshold voltages of previously programmed memory cells may increase so that threshold voltage distributions change in what may be referred to as "program disturb." This may cause misreading of data. In order to reduce such program disturb effects, programming may be performed in two or more operations to allow programming of adjacent memory cells before programming is finalized. For example, a first programming operation may program a group of memory cells to first distributions that are close to the final distributions in what may be referred to as a foggy programming operation. Then, memory cells of one or more neighboring word line may be programmed. Subsequently, after the neighboring cells are programmed, another program operation (fine programming operation) may program the group of memory cells to second distributions (e.g., final distributions like those shown in FIGS. 7A and 7B). Programming to first (approximate or foggy) distributions and subsequently programming to second (accurate or fine) distributions in this way may be referred to as foggy-fine programming.

Figure 15:
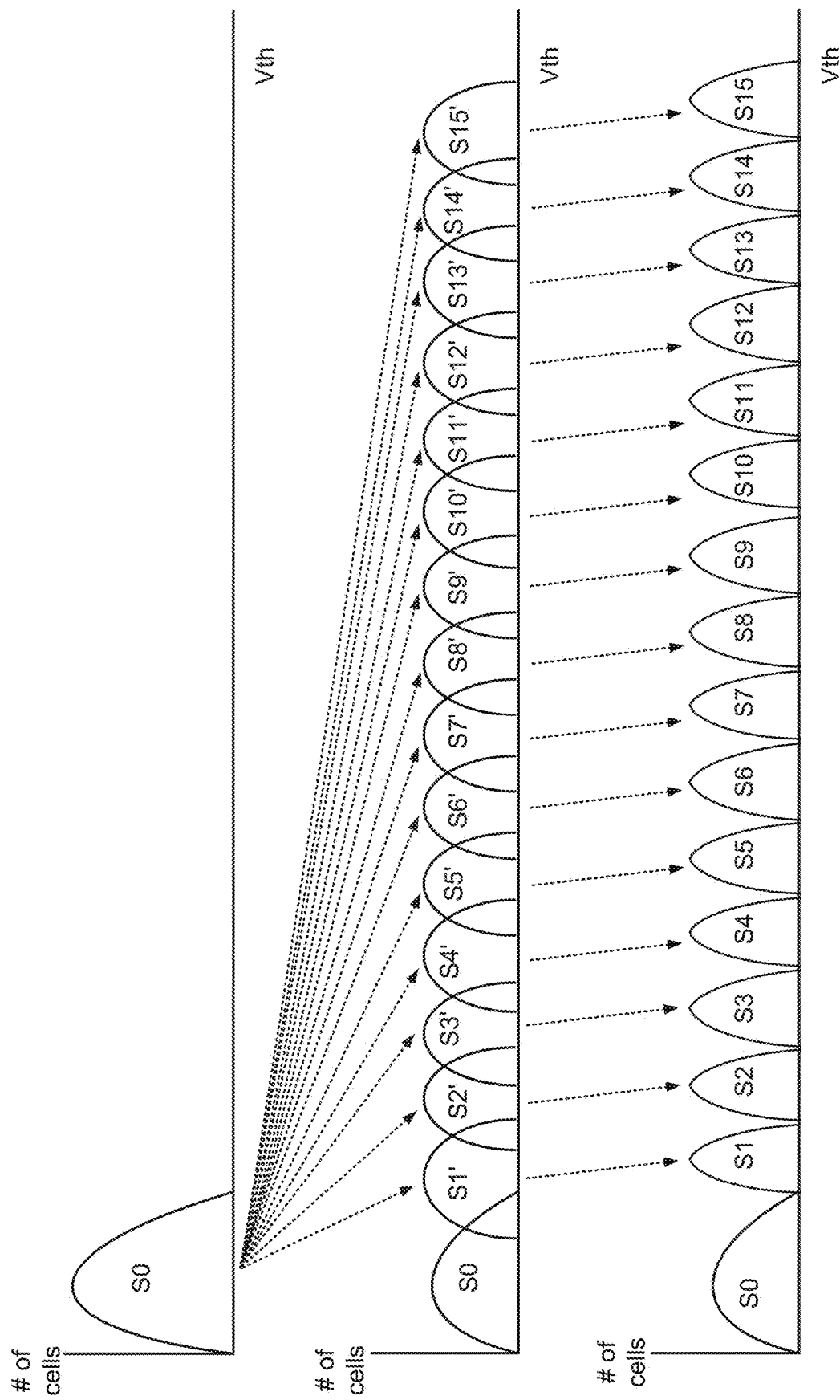
FIG. 15 illustrates an example of foggy-fine programming in a 4-bit per cell embodiment using sixteen distributions corresponding to sixteen data states.

FIG. 15 illustrates an example of foggy-fine programming of a group of 4-bit per cell, or quad-level cell (QLC), memory cells using sixteen distributions corresponding to sixteen data states. All memory cells may be in an erased distribution (e.g., distribution S0) shown at top prior to foggy programming. Foggy programming programs memory cells to the first distributions S1' to S15' shown in the middle of FIG. 10. Fine programming subsequently programs the memory cells to the second distributions S1 to S15 shown on the bottom. There may be some time between these two program operations and one or more other groups of memory cells may be programmed during that time. It will be understood that memory cells of a given first distribution are subsequently further programmed to a corresponding second distribution without erasing memory cells between so that fine programming does not start from the erased distribution. For example: memory cells that are programmed to the S1' distribution in a foggy program operation are subsequently further programmed to the S1 distribution in a fine program operation; memory cells that are programmed to the S2' distribution in a foggy program operation are subsequently further programmed to the S2 distribution in a fine program operation; memory cells that are programmed to the S3' distribution in a foggy program operation are subsequently further programmed to the S3 distribution in a fine program operation; and so on.

First distributions S1' to S15' are generally wider than second distributions S1-S15 and there is significant overlap between adjacent distributions (e.g., distribution S1' overlaps distribution S2', distribution S2' overlaps distribution S3' and so on). Programming to first distributions may use the same programming steps as used for second distributions or may use different steps (e.g., programming pulses of the same voltage and time or different voltage and/or time). Reading memory cells that are in the first distributions S1' to S15' using standard read voltages (such as shown in FIG. 7B for a 3-bit per cell embodiment) may provide a large number of errors (e.g., more errors that can be corrected by ECC) because of such overlaps so that another source may be used for fine programming. In some embodiments, a safe copy of the data may be maintained in another location between foggy program and fine program operations so that a good copy is available for fine programming. For example, a copy of the data may be written in additional non-volatile memory cells (e.g., in SLC memory cells, which may be in the same memory structure as the QLC memory cells, or elsewhere) or in a volatile memory for subsequent fine programming.

Between foggy programming and fine programming of a given word line, one or more other word lines (e.g., nearby word lines that may have some coupling with the given word line) may be programmed. FIG. 16 shows an example of a programming scheme that may be used to program word lines of four fingers of a 3D NAND structure illustrated in example FIGS. 6A-6F, where the fingers are described with respect to FIG. 6A and correspond to STR0 to STR3. The first column on the left indicates that word line (WL) and the next column (STAGE) indicates the programming stage as either FOGGY or FINE for each of the four fingers STR0 to STR3. Numbers at each entry indicate the order of foggy and fine programming of different fingers and word lines. Arrows are used to indicate order of some steps.

Programming starts with foggy programming of WL0 of STR0, STR1, STR2 and STR3, followed by foggy programming of WL1, STR0, and then fine programming of WL0, STR0. This is followed by: foggy programming WL1, STR1, then fine programming WL0, STR1; foggy programming WL1, STR2, fine programming WL0, STR2; foggy programming WL1, STR3, fine programming WL0, STR3; followed by foggy programming of WL2, STR0; and so on. It can be seen that between foggy programming and fine programming of a given group of memory cells, other memory cells are programmed (e.g., foggy programmed) so that fine programming occurs after coupling effects of neighboring cells are already in place and thus program disturb effects are reduced. For example, while foggy programming of WL1, STR0 is the fourth program operation in FIG. 15, fine programming of WL1, STR0 is the thirteenth program operation so that nine other program operations occur in between. A copy of data that is foggy programmed and has not yet been fine programmed may be saved in a safe location until fine programming is complete (e.g., a safe copy of data for WL1, STR0 may be maintained between the fourth and thirteenth operations of FIG. 11). Maintaining a safe copy may take significant resources both in terms of storage space (e.g., in volatile or non-volatile memory) and in terms of bus usage to transfer the data.

In a memory system with a folding scheme, a balance between the writing of host data coming into SLC memory versus the SLC→MLC folding needs to be maintained so as to avoid running out of SLC blocks. One way to obtain such balancing is by suspending an ongoing SLC→MLC fold operation and execute SLC host programming. Once the SLC program is complete, the MLC write operation can be resumed. This method will help to hide the transfer of SLC host data from the memory controller's memory interface 228/258 (see FIG. 2A) in the background while the MLC operation is ongoing. This is illustrated for a 4-bit per MLC, or QLC, example in FIG. 17.

Figure 17:
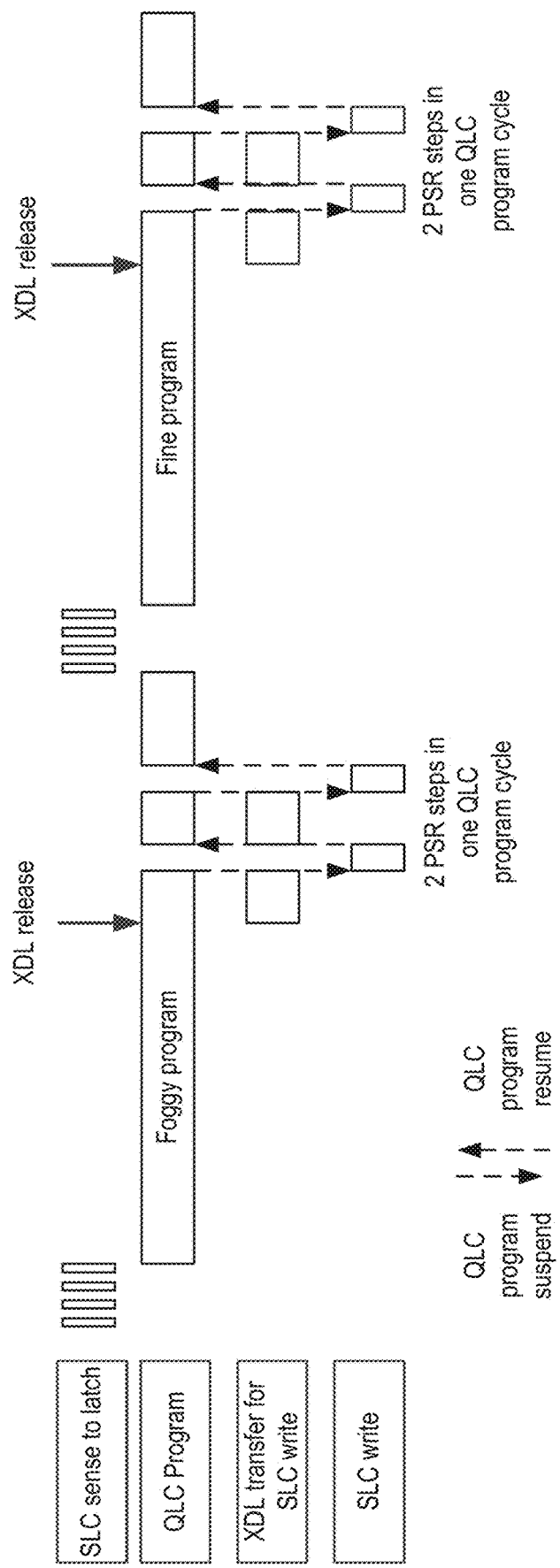
FIG. 17 is a schematic representation of transfers of host data for an SLC write performed during the background folding operation.

FIG. 17 is a schematic representation of transfers of host data for an SLC write performed during the background SLC→QLC folding operation. In FIG. 17, an SLC→QLC folding operation is shown for rewriting data previously written in SLC format. Initially, as shown in the top row, for a QLC folding, four pages of data are sequentially read from four word lines and stored into the data latches, such as the XDL, ADL, BDL, and CDL latches of the data latches 484 of FIG. 4. As shown on the second line, once the SLC data is latched a foggy QLC programming operation can start based on the latched data, where the latches are sequentially released as the programming progresses. For example, the latched can be released sequentially in the order XDL, ADL, BDL, CDL as the different bits become no longer needed. Once foggy programming is complete, the memory can move to a fine programming according to the order of FIG. 16, for example, and reads out the QLC target programming data from its SLC locations and into the latches, after which the fine program operation is performed. For both the foggy program and the fine program, in the latter stages of the program a first of the latches (here XDL) is no longer needed from programming and can be released.

Once the XDL latches are released, they are available to receive host data for an SLC write transferred in, where, as illustrated in the third line of FIG. 17, this can be done as the foggy or fine programming of the SLC→QLC continues. This allows for these transfer times to be hidden behind the background folding operations. Once the XDL latches are loaded for the SLC write of incoming host data, the QLC programing is suspended and the SLC data written in an SLC block based on the XDL target data in a program suspend program-suspend-resume (PSR) cycle, where, once the SLC write is complete, the foggy or fine QLC program is resumed. As the XDL latches are again free and another transfer of host data for an SLC write can be hidden behind the resumed QLC write. Once the XDL latches are again loaded, the QLC write is again suspended, the SLC write performed, and the QLC write resumed to completion for either of the foggy or fine program. In the example of FIG. 17, two program-suspend-resume cycle are inserted into each of the foggy or fine QLC program cycles and, although shown to be of about the same duration in the schematic representation of FIG. 17, the fine program phase is typically ~2-3 times as long as the foggy phase.

The duration of the window available for transfer of host data to the XDL latches (the third line of FIG. 17) for the SLC write depends on when the XDL latches release, which depends on the memory design. As memory designs progress, these time windows for such transfers from the controller to the XDL tend to become shorter as the usage of the XDL transfer latch becomes more intense. For example, as noted above, a QLC fine programming phase often takes about two to three times longer than the foggy phase and, in both cases the XDL latches are not released until about three quarters of the way through the program operation, with the other latches (e.g., ADL, BDL, CDL) subsequently being sequentially released. Because of this, in memories using a folding scheme, there may only be a narrow window available to perform QLC program-suspend-resume operations for SLC host data to manage balancing. This is also aggravated as data density increase since, for example, in 4-level QLC folding one balancing cycle involves 4 SLC pages to be programmed in comparison to 3 SLC pages required for 3-level TLC folding. This narrow window and additional SLC pages for balancing creates bottlenecks for controller to XDL transfers of host SLC data. The following presents embodiments to help reduce such bottlenecks by managing fold step ordering across multiple dies.

Figure 18:
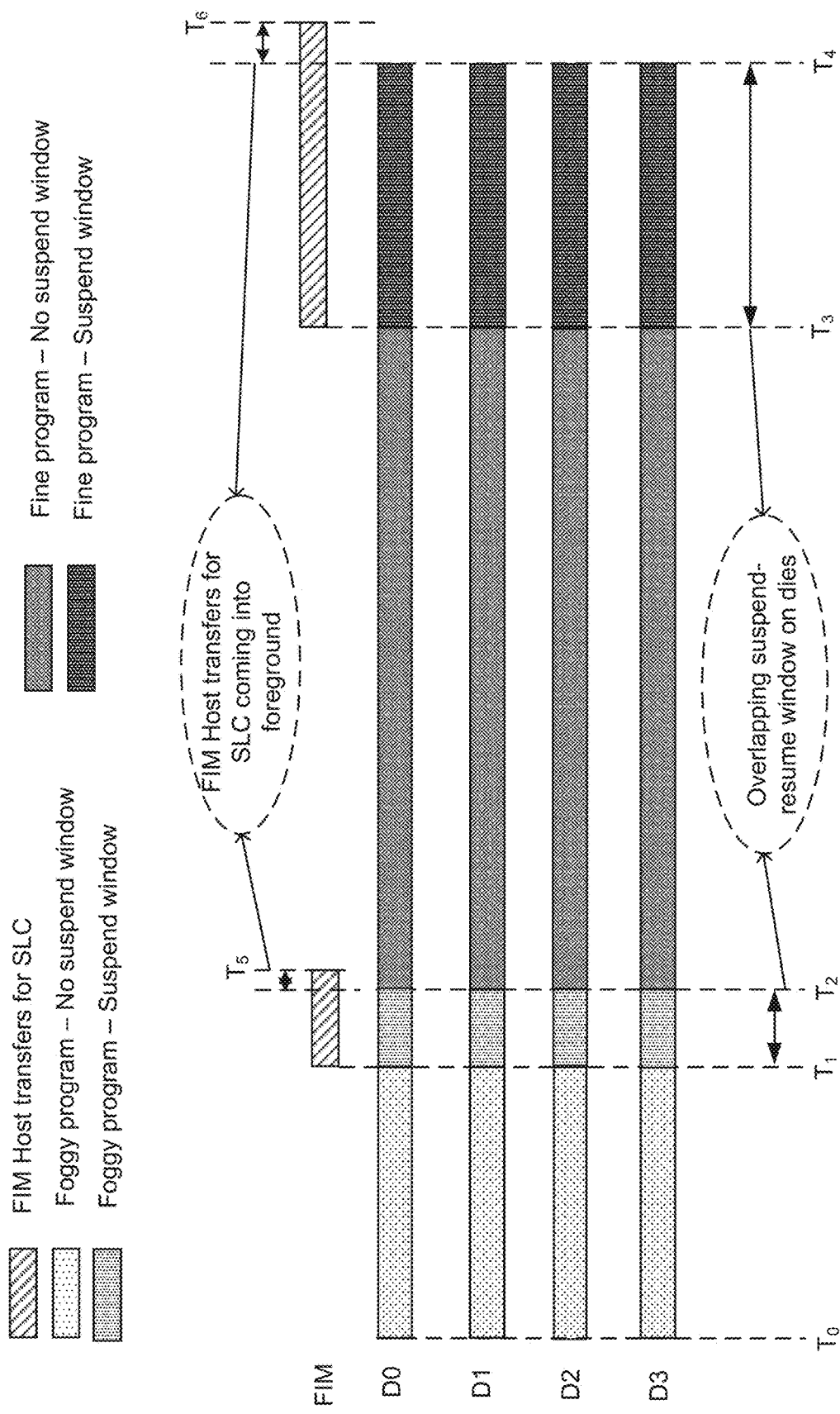
FIG. 18 illustrates the program-suspend-resume windows during a foggy-fine programming operation for a folding operation when four dies are operated in parallel.

Returning to FIG. 2A, to increase performance through increased parallelism, the memory interfaces 228/258 for memory controller 102 operate multiple channels in parallel. In the example of FIG. 2A, each memory interface 228/258 and supporting elements, or Flash Interface Module (FIM), has four channels for communicating with a set of four memory dies. In using a parallel approach, when data undergoes an SLC→MLC folding operation, the same folding step of either foggy or fine programming is performed on all the dies at once, with all dies performing either a foggy or fine step at a given point of time. Due to this, all dies would reach the first cache release time (XDL release) at the same time. Consequently, the window for effectively hiding host SLC transfers behind QLC program operations would start and end at same time on all dies managed together. The FIM transfers from the controller of SLC host data is sequential across dies. If FIM transfers on all dies cannot complete within the suspend-resume window, any leftover FIM transfers come to foreground. The narrower the suspend-resume window, the more FIM transfers that come into foreground and impact sustained memory performance. FIG. 18 illustrates this overlapping suspend-resume window bottleneck for the 4 die per FIM example.

FIG. 18 illustrates the program-suspend-resume windows during a foggy-fine programming operation for a folding operation when four dies are operated in parallel. The dies are labelled D0-D3 and begin a foggy program at $T_0$ and finish the foggy program at $T_2$, where the programming cannot be suspended until $T_1$ when the XDL latches release as described with respect to FIG. 17. The suspend-resume window then lasts from $T_1$-$T_2$, overlapping on four of the dies. The fine program phase then begins at $T_2$ and concludes at $T_4$, where fine programming cannot be suspended until $T_3$, with the suspend resume window lasting from $T_3$ to $T_4$ for all four dies. During the intervals $T_1$-$T_2$ and $T_3$-$T_4$, transfers from the controller to the XDL latches can be hidden, background operations as illustrated in more detail in FIG. 17. The top line in FIG. 18, FIM, illustrates the transfer of SLC host data by the controller into the XDL latches. The FIM transfers can begin at both $T_1$ and $T_3$ and, respectively until $T_2$ and $T_4$, can be hidden behind the MLC programming. However, if the FIM transfer is not complete by $T_2$ or $T_4$ and extend to $T_5$ or $T_6$, respectively, the transfers come into the foreground and the next MLC programming phase will have to wait to begin.

The diagram of FIG. 18 is somewhat simplified with respect to FIG. 17. The on-chip copy of the SLC sense to latches (top line FIG. 17) required for each of QLC program steps also falls within the time where host SLC transfers cannot be done and, in FIG. 18, are included as part of program no-suspend depiction. Firmware overhead times are marginal in comparison with overall QLC program foggy/fine step operation time and are not explicitly shown. In the example of FIG. 18, foggy-fine relative program times are taken as on the order of 1:3, so that an SLC host data balancing of 1:3 is considered in the diagram and SLC programming times are taken to be about the same as the SLC host data transfer times.

As seen from the transfer diagram of FIG. 18, the suspend-resume window of all the dies is overlapping and concurrent. Although an effective way to balance host SLC writes vs QLC programming for folding is to perform all SLC operations as QLC program-suspend-resume, so that the FIM transfers for SLC host is hidden behind QLC program operation, the suspend-resume window can be narrow with first latch releases not coming until around 75% of QLC programming time. This can restrict the number of SLC host transfers of all four dies within the window so that these transfer come into the foreground. To maintain balance, the next fold step cannot be taken before completing pending SLC host data transfer, so that the dies are not getting utilized effectively and performance is impacted. As SLC transfers of host data come into foreground, the next foggy/fine step would be staggered for a few dies further into transfer diagram. This would mean that in further cycles of foggy-fine, some part of suspend-resume window may not overlap, which could result in extending the time available for SLC host transfers to complete within suspend-resume window. Consequently, the program-suspend-resume window is critical for maintaining the balance between SLC writes of host data and the background SLC→MLC folding operations and in the arrangement of FIG. 18 the SLC writes of host data may not be performable within the available window, causing performance penalties.

Figure 19:
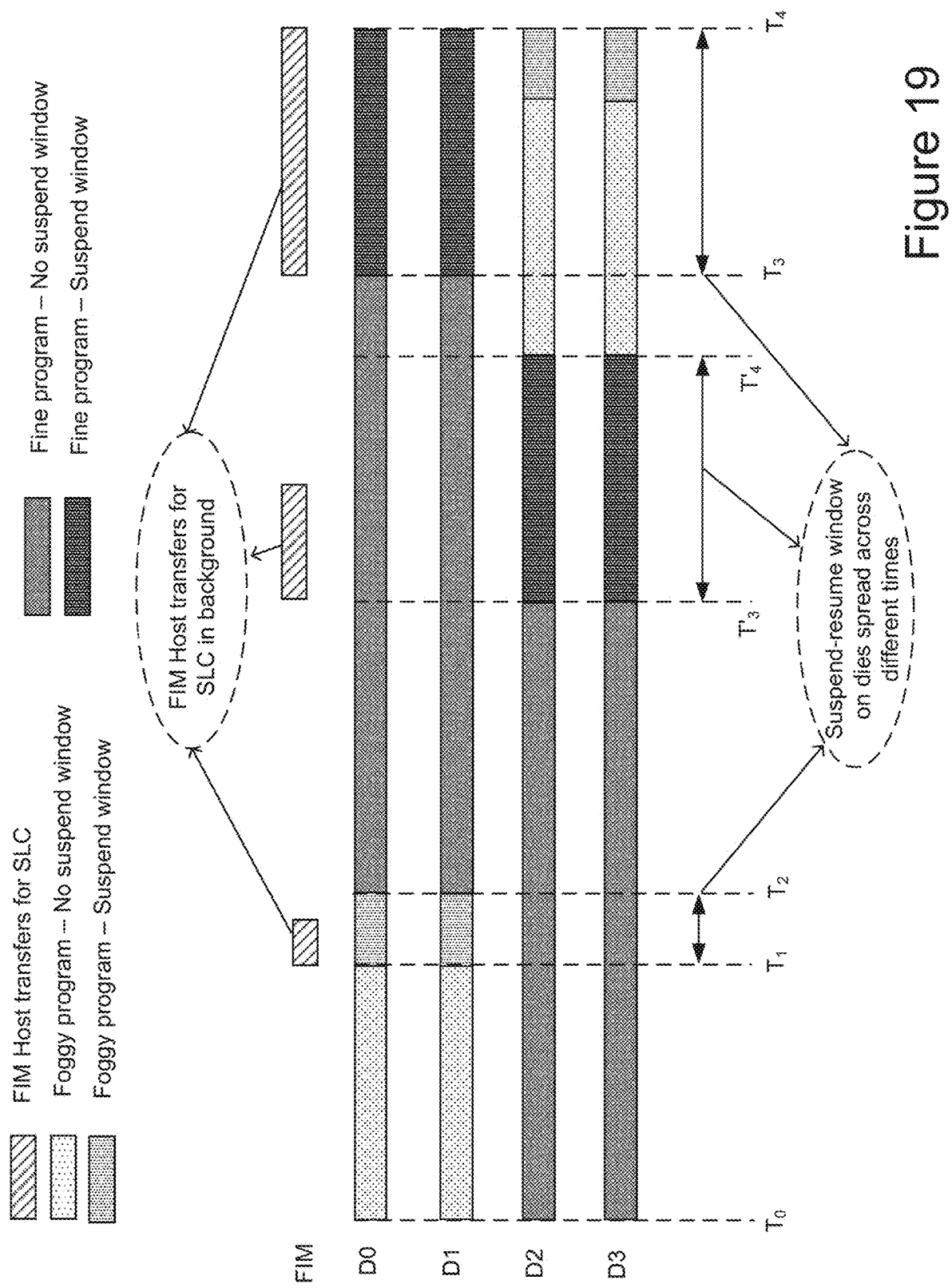
FIG. 19 illustrates the program-suspend-resume windows during a foggy-fine programming operation for a folding operation in which a group of dies are operated in two sets with differing programming phases.

To address this issue, the following presents embodiments for the SLC→MLC fold a step ordering scheme that distributes the suspend-resume window of the dies along multiple timelines in comparison to overlapped suspend-resume windows in the arrangement of FIG. 18. This approach can effectively remove the FIM bottleneck that can result from the embodiment of FIG. 18 and all SLC host transfers would come into the background of the SLC→MLC fold operations. More specifically, the embodiments presented in the following discussion divides the group of dies operated in parallel as a group by interface manager of the controller two sets. While one set of dies perform the foggy stage of QLC programming, the other set performs the fine step of QLC programming. With foggy/fine programming time ratio on the order of 1:3, there will be a mismatch in the suspend-resume windows of dies belonging to different sets. As a limited number of the FIM's group of dies would be in a suspend-resume window, SLC operations (SLC transfers) that would be required to finish in that window are effectively reduced. As a result, all FIM transfers required for host SLC operations would be hidden in background of QLC operation. FIG. 19 illustrates an embodiment when the suspend-resume windows for dies of the different sets are non-overlapping, avoiding the previous SLC host data transfer bottleneck.

FIG. 19 illustrates the program-suspend-resume windows during a foggy-fine programming operation for a folding operation a group of dies are operated in two sets with differing programming phases. The example of FIG. 19 and similar figures below again use a four die per memory interface 228/258 and supporting FIM elements, with the dies split into two sub-sets of two with staggered programming pipelines, but other embodiments can be used. For a given one of the dies, the same design is still used and can operate as illustrated with respect to FIG. 17; however, the occurrence of the foggy phase and fine phase are offset between the two sub-sets of dies.

FIG. 19 is laid out similarly to FIG. 18 and the order of programming phases is the same for D0 and D1, with a foggy program beginning at $T_0$ followed by a fine program beginning at $T_2$. During the foggy program phase, the XDL latches free up at $T_1$ and transfers of SLC host data from the controller can be made during the interval $T_1$-$T_2$ for the XDL latches of D0 and D1. For the second sub-set of dies D2 and D3, a fine program starts at $T_0$ and continues until $T'4$, where these fine programs are for word lines that previously underwent the corresponding foggy programs. The XDL latches for D2 and D3 free up at $T'_3$ and FIM host transfers can be made to these XDL latches during the interval of $T'_3$-$T'_4$. Returning to D0 and D1, during the fine program phase, the D0 and D1 XDL latches free up at $T_3$ and transfers of host data for SLC programming can be performed between $T_3$-$T_4$, with the XDL latches of D2 and D3 also becoming available in the latter part of this interval.

Considering FIG. 19 further, while D0 and D1 perform a foggy QLC step, D2 and D3 performs fine QLC step, where the program-suspend-resume amongst foggy-fine steps is taken as ~1:3. As the foggy phase program time is smaller, the suspend-resume window on D0 and D1 opens up earlier and during this time interval $T_1$-$T_2$, the controller can efficiently transfer 1 SLC host page data per die in background, after which D0 and D1 can start fine programming. On D2 and D3, the fine step program suspend-resume window $T'_3$-$T'_4$ would open some time later during the D0, D1 fine programming phase, during which D0 and D1 would not be in a suspend-resume window. During $T'_3$-$T'_4$, the controller can efficiently transfer 3 SLC host pages of data per die for D0 and D1, which can be possible as the effective number of dies taking SLC host data has been halved. Subsequently, on D0 and D1, the fine program suspend-resume window opens at $T_3$, during this time, D2 and D3 are still performing foggy programming and their transfer window is not open. During $T_3$-$T_4$, the controller can perform SLC host data transfers to the XDL latches of D0 and D1 of, for example up to 5 pages of data (e.g., 3 on D0 and 2 on D1) could be completed before the XDL latches on D2 and D3 during their foggy programing phase. Once the fine program-suspend window opens for D0 and D1, the foggy program resume-suspend window is still open for D2 and D3 and XDL latches are available on all four dies and, for example, during this time up to 3 SLC host data page transfers on each of D1, D2, and D3 can be completed.

Under this arrangement, all of the transfers from the controller of host data for SLC programming can be completed within the available program-suspend-resume windows of the SLC→MLC folding operations. This allows the transfers of host data to the XDL latches for SLC programming to be hidden behind the MLC programming, helping to improve memory performance. The embodiment of FIG. 19 uses, as will the following embodiments, an example where each memory interface 228/258 includes four die interfaces. The embodiments can similarly be applied to other cases of differing numbers of the set of dies per interface, and differing numbers of dies in the sub-sets, where one sub-set is programming in a fine mode while the other sub-set is programming in a foggy mode, and where staggered programming pipelines are applied to the sub-sets of dies. Additionally, a similar scheme using un-even programming timing for non-overlapping suspend-resume can be applied to other NAND programming operation sub-phases with varying timings, such a three phase MLC (e.g., first-foggy-fine or foggy-intermediate fine-fine) programming operation. In such embodiments, the die groups can be formed with different counts and with each group performing different sub-steps of the multi-phase program, further distributing suspend-resume windows across the programming timelines and further relaxing controller to die host data transfer requirements.

In a foggy-fine programming, such as illustrated in FIG. 15, the S0 state is programmed to a foggy version of all of the MLC states where there is significant overlap of the foggy state distributions, after which the states are further programmed to fine state distributions with better definition. Other multi-phase programming can also be used, such programming the memory cells from the S0 state to first MLC distributions of an intermediate number of states, followed by a fine distribution to the full MLC distributions. For example, when storing data in a 4-bit per cell QLC format, the memory cells can first be written to 2-bit per cell MLC distributions by writing each of their memory cells to distributions based on their upper most 2 bits, followed by a second programming phase to write the memory cells to their full 4-bit per cell (QLC) distributions. An example of this can be illustrated with respect to FIG. 20.

Figure 20:
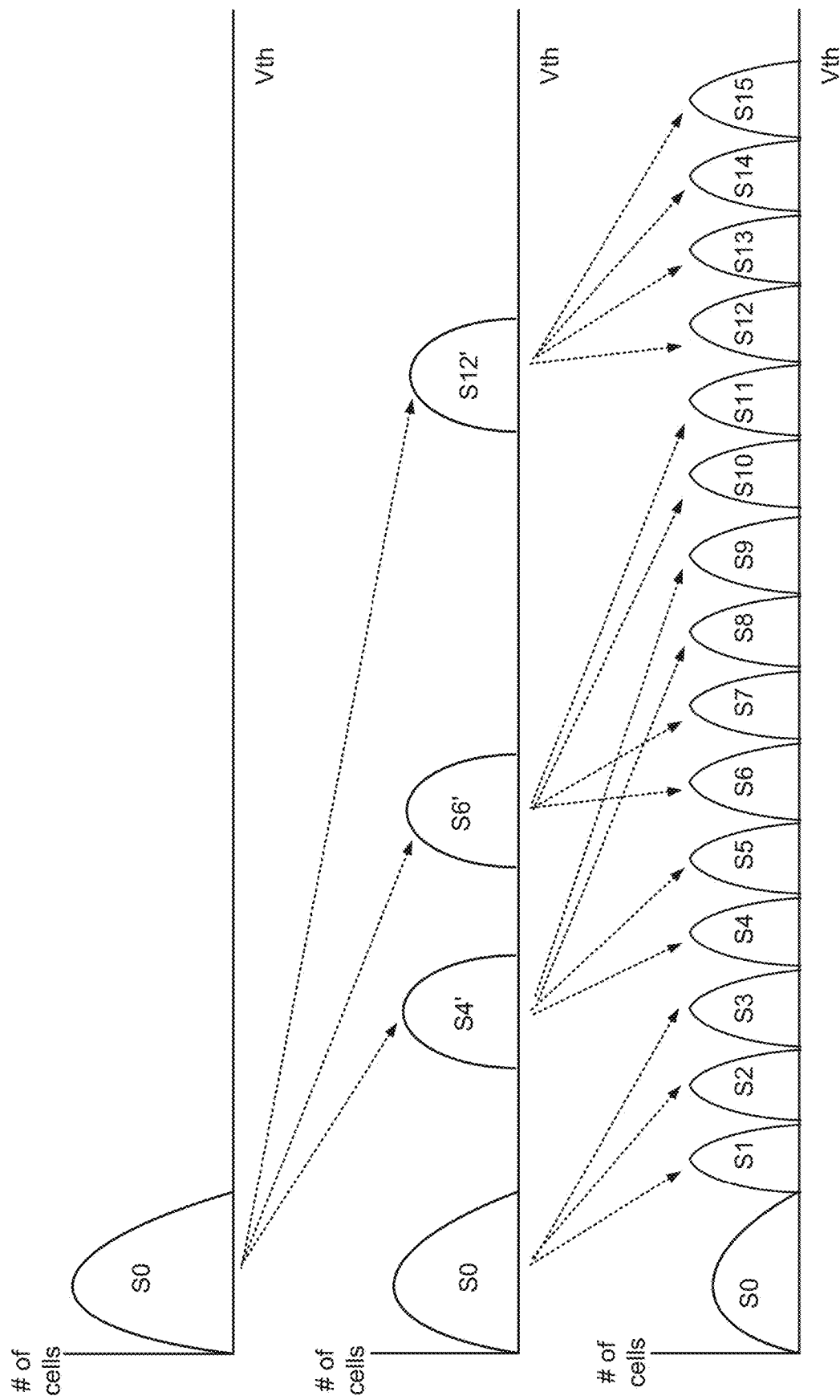
FIG. 20 illustrates an embodiment of a two phase multi-state programming operation in which the memory cells are first programmed to first multi-state distributions based on a sub-set of the bits of their full multi-bit values, followed by a further multi-level fine stage program to the full multi-bit values.

FIG. 20 illustrates an embodiment of a two phase multi-state programming operation in which the memory cells are first programmed to first multi-state distributions based on a sub-set of the bits of their full multi-bit values, followed by a further multi-level fine stage program to the full multi-bit values. This alternate MLC-fine programming operation can reduce memory requirements on the memory die as the initial MLC stage only uses a sub-set of the pages for the target data state, such as only using 2 pages of data for the MLC program, rather than a full 4 pages of the QLC data. The programming order on each die can again use a word line, finger, and programming phase order similar to that of FIG. 16, except with fine and MLC phases rather than fine and foggy.

As illustrated in the upper two lines of FIG. 20, in this example the memory cells are initially programmed from the S0 distribution to the intermediate 2-bit per cell format of the distributions S0, S4', S6', and S12' corresponding to the upper most two data pages, followed by the fine programming to incorporate the other two pages of data for the full QLC format. The initial MLC→final MLC programming algorithm may require relatively less programming time compared to foggy-fine programming when the final MLC/fine programming with 16 states. The techniques presented here for using staggered pipelines for different sub-sets of the full set of dies managed by each memory interface 228/258 can used with the MLC-fine programming efficiently distribute FIM transfers across various times.

The example of FIG. 19 illustrates a program time ratio for the foggy/fine phases of ~1:3, although other ratios can occur based on a given memory's design. In this case, to maintain balancing between host data SLC programming to SLC→QLC folding, a corresponding 1:3 pages of SLC is depicted per program step. In the multi-die scenario, this translates to (1 page*N Dies):(3 pages*N dies) of SLC programming, in the 4 die system implementation, this ratio will be 4:12 SLC host data writes per foggy-fine folding, where this ration can be effectively applicable to schemes with overlapping windows. In the presented scheme having windows with non-overlapping portions, the SLC transfer windows will be un-even. In such cases, balancing can be designed per pattern to effectively hide SLC transfers in background of the folding operations QLC programming. Page level balancing granularity can be used to help to manage SLC transfers in a system with higher die count per memory management module.

Figure 21:
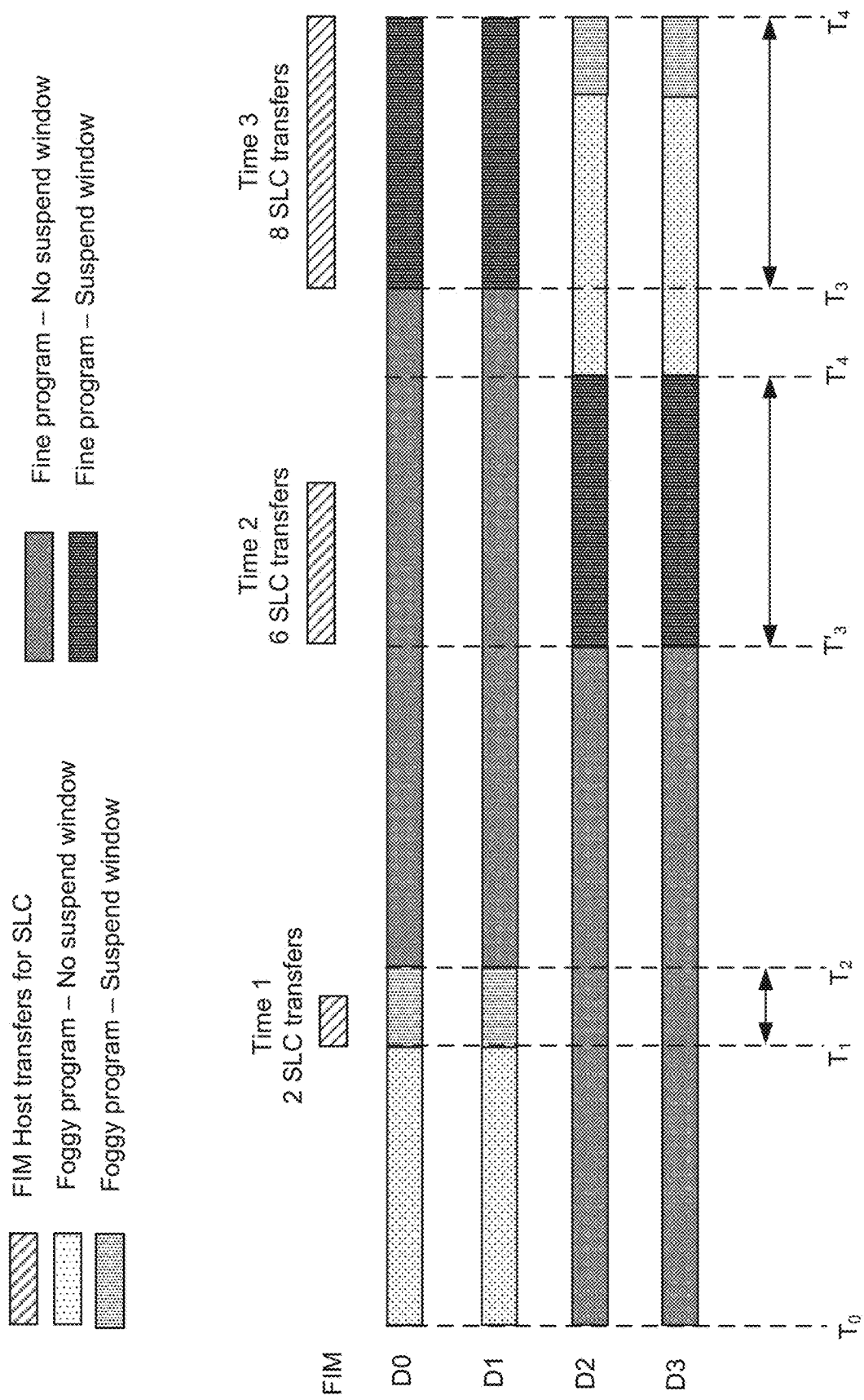
FIGS. 21 and 22 illustrate alternate embodiments for distributing the transfers of host SLC data across the suspend-resume windows of the background folding operations.
Figure 22:
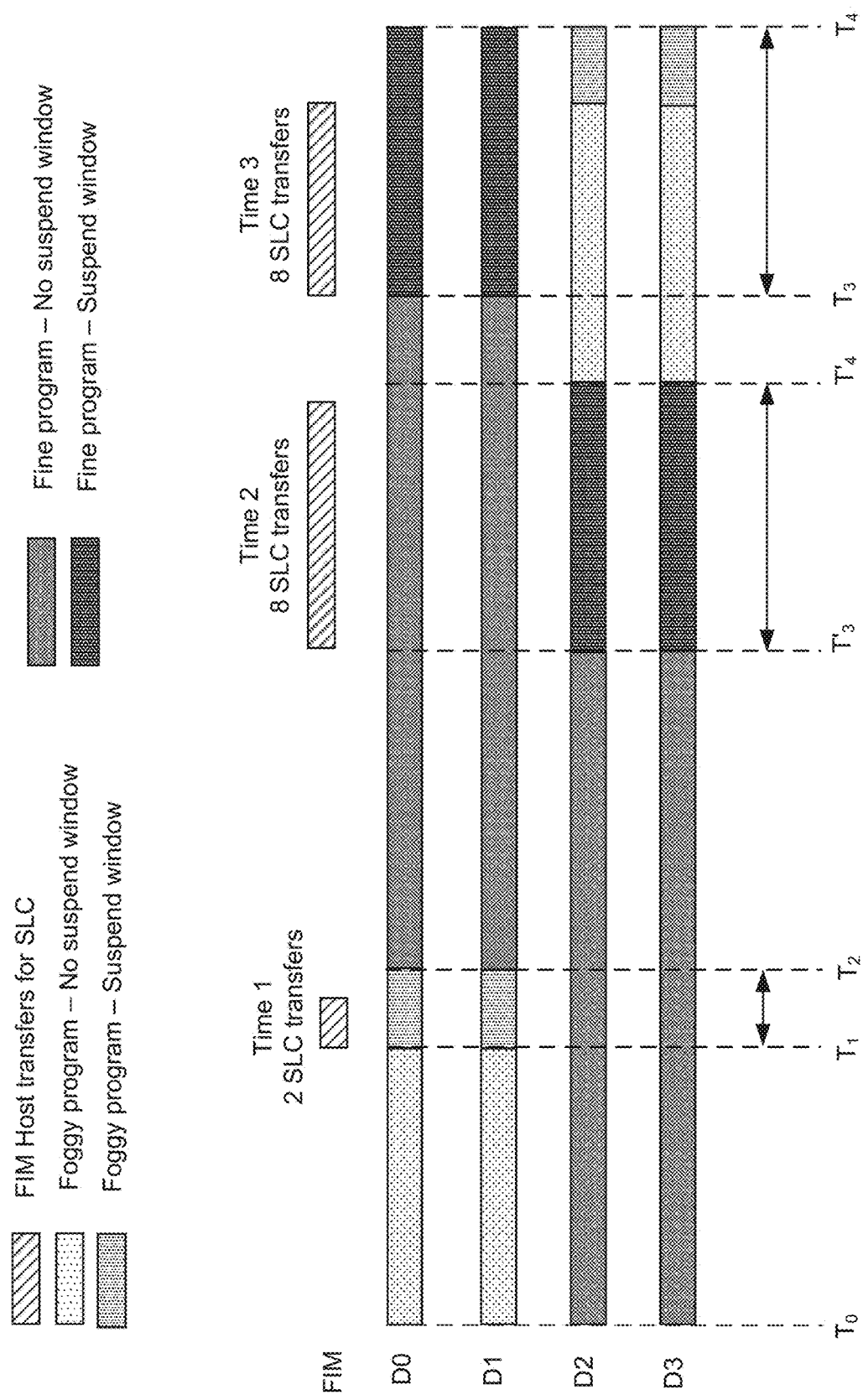

FIGS. 21 and 22 illustrate alternate embodiments for distributing the transfers of host SLC data across the suspend-resume windows of the background folding operations. As illustrated in FIG. 19, there are three suspend-resume windows per foggy-cycle of the staggered programming pipelines: $T_0$-$T_2$, $T'_3$-$T'_4$, and $T_3$-$T_4$. FIGS. 21 and 22 are laid similarly to FIG. 19, but illustrate different examples of distributing the SLC host data transfers across the suspend-resume windows Time 1=$T_0$-$T_2$, Time 2=$T'_3$-$T'_4$, and Time 2=$T_3$-$T_4$. In the example of FIG. 21, the SLC host data transfers are done in the ratios of: Time 1/Time 2/Time 3=2 SLC: 6 SLC: 8 SLC pages. The example of FIG. 22 uses SLC host data transfers in the ratios of Time 1/Time 2/Time 3=2 SLC: 6 SLC: 8 SLC pages, where, for higher die number configurations, more SLC host data transfers can at can be avoided by distributing more transfers to Time 1 and Time 2.

Figure 23:
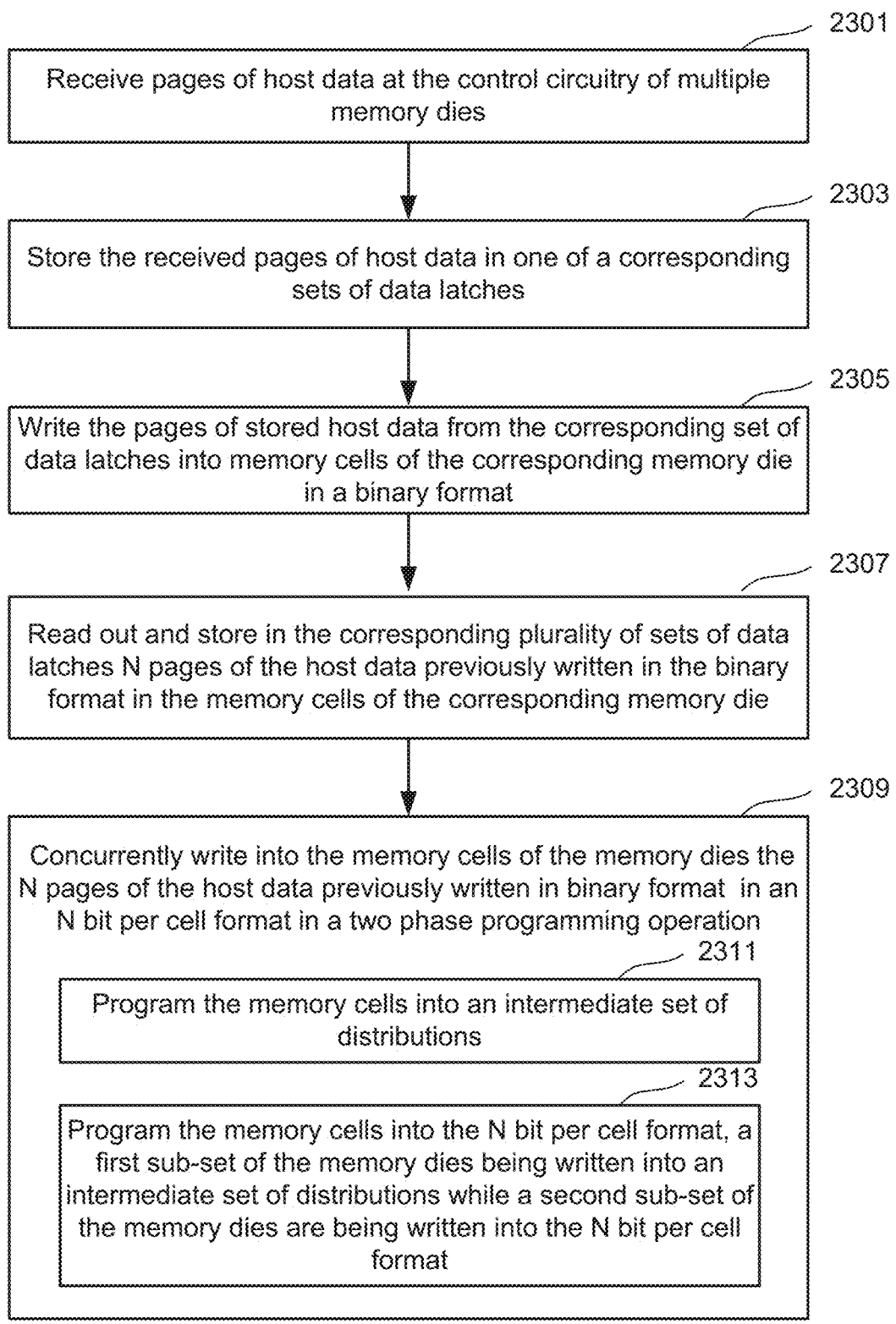
FIG. 23 is a flowchart for an embodiment for improving the throughput of a non-volatile memory system that initially writes data in a binary format and then folds the data into a multi-state format.

FIG. 23 is a flowchart for an embodiment for improving the throughput of a non-volatile memory system that initially writes data in a binary format and then folds the data into a multi-state format. Beginning at step 2301, pages of host data are received from the memory interface 228/258 of non-volatile memory controller 102 and, at step 2303, stored in the data latches 484 of the system control logic of the memory die control die of FIG. 3A/3B. The host data is then written into the memory cells of the memory dies from the data latches 484 into the memory cells of memory dies memory arrays 302 using the system control logic 360, row control circuitry 320, and column control circuitry 310. The pages of host data written into the memory die 300/301 in a binary, or SLC, format then undergo a background folding operation to be rewritten in an MLC format for higher density storage. The folding operation occurs in step 2309 and its sub-steps 2311 and 2313.

The data folding operation on the multiple memory die occurs at step 2309. As discussed with respect to FIGS. 17-22, the memory controller's flash management module manages a set of memory die (four in the example) in parallel. In step 2309, for each of the memory die the corresponding control circuit reads out N page of data previously written in a binary format into the data latches 484 and programs these, in an N-bit per cell format into the memory cells of memory dies memory arrays 302 using the system control logic 360, row control circuitry 320, and column control circuitry 310 as described with respect to FIGS. 12-16 and 20. The MLC programming operation is performed in a two phase programming operation, with the initial programming phase at step 2311 can be either a foggy programming operation as described with respect to FIG. 15 and an MLC programming operation with some intermediate number of bits (i.e., M bits, where 1<M<N) as illustrated in FIG. 20, where the memory cells are first programmed to intermediate 2 bit per cell distributions before being programmed to the full 4 bit per cell QLC distributions in step 2313. As illustrated in FIGS. 19, 21, and 22, one sub-set of the memory dies are written in the initial programming phase of step 2311 while a second sub-set of one or more memory dies are being written in the fine programming phase of step 2313. These embodiments, as developed with respect to FIGS. 12-23, enable higher sustained write performance without adding cost to non-volatile memory controller by enabling efficient usage of memory control for SLC host data transfers in folding schemes with non-overlapping suspend-resume windows of MLC programming.

According to a first set of aspects, a non-volatile memory device comprises a plurality of control circuits each configured to connect to a plurality of non-volatile memory cells of a corresponding memory die, each of the control circuits comprising a corresponding plurality of sets of data latches configured to store data to be written to and data read from the non-volatile memory cells of the corresponding memory die. Each of the control circuits are configured to perform a folding operation of pages of host data previously written in binary format in the memory cells of the corresponding memory die to be written in an N bit per cell format in the memory cells of the corresponding memory die. To perform the folding operation, each of the control circuits is configured to: read out and store in the corresponding plurality of sets of data latches N pages of the host data previously written in the binary format in the memory cells of the corresponding memory die; and write the N pages of the host data previously written in binary format into memory cells of the corresponding memory die in the N bit per cell format in a two phase programming operation in which the memory cells are programmed into an intermediate set of distributions in an initial programming phase and subsequently programmed into N bit per cell format in a fine programming phase, where the plurality of control circuits are configured to perform the folding operation on the plurality of corresponding memory die concurrently, a first sub-set of one or more of the control circuits performing the initial programming phase while a second sub-set of one or more control circuits are performing the fine programming phase.

In additional aspects, a method includes: receiving, at each of a plurality control circuits for a corresponding memory die, pages of host data from a non-volatile memory controller managing the plurality of control circuits in parallel, each of the memory dies comprising a plurality of non-volatile memory cells and each of the control circuits comprising a corresponding plurality of sets of data latches configured to store data to be written to and data read from the non-volatile memory cells of the corresponding memory die; storing the received pages of host data in one of the corresponding sets of data latches of each of the control circuits; writing the pages of host data stored in the one of the corresponding set of data latches into memory cells of the corresponding memory die in a binary format; reading out and storing in the corresponding plurality of sets of data latches N pages of the host data previously written in the binary format in the memory cells of the corresponding memory die; and concurrently writing into the memory cells of the plurality of memory dies the N pages of the host data previously written in binary format into memory cells stored in the corresponding plurality of sets of data latches in an N bit per cell format in a two phase programming operation. The two phase programming operation can comprise: an initial programming phase in which the memory cells are programmed into an intermediate set of distributions; and a fine programming phase in which are programmed into the N bit per cell format, a first sub-set of one or more of the memory dies being written in the initial programming phase while a second sub-set of one or more memory dies are being written in the fine programming phase.

In another set of aspects, a non-volatile memory device includes a plurality of memory dies each comprising a plurality of non-volatile memory cells; means for receiving and writing pages of host data into the memory cells of each of the corresponding memory dies in a binary format; means for reading out and latching N pages of the host data previously written in the binary format in the memory cells of each of the corresponding memory dies; and means for concurrently writing the latched N pages of the host data previously written in binary format into memory cells of each of the corresponding plurality of memory dies in a N bit per cell format in a two phase programming operation in which the memory cells are programmed into an intermediate set of distributions in an initial programming phase and subsequently programmed into the N bit per cell format in a fine programming phase, a first sub-set of one or more of the corresponding memory dies being programmed in the initial programming phase while a second sub-set of one or more of the corresponding memory dies being programmed in the fine programming phase.

In one set of embodiments the means for receiving and writing pages of host data into the memory cells of each of the corresponding memory dies in a binary format can include the system control logic 360, row control circuitry 320, and column control circuitry 330 of FIGS. 3A and 3B.

In one set of embodiments the means for reading out and latching N pages of the host data previously written in the binary format in the memory cells of each of the corresponding memory dies can include the system control logic 360, row control circuitry 320, and column control circuitry 330 of FIGS. 3A and 3B, with the means for latching including the data latches 484 of sense amplifiers 350 of FIG. 4.

In one set of embodiments the means for concurrently writing the latched N pages of the host data previously written in binary format into memory cells of each of the corresponding plurality of memory dies in a N bit per cell format can include the system control logic 360, row control circuitry 320, and column control circuitry 330 of FIGS. 3A and 3B, with the means for latching including the data latches 484 of sense amplifiers 350 of FIG. 4. Detail is also described with respect to FIGS. 12-14. The two phase programming operation in which the memory cells are programmed into an intermediate set of distributions in an initial programming phase and subsequently programmed into the N bit per cell format in a fine programming phase can be illustrated with respect to FIGS. 15, 16, and 20. A first sub-set of one or more of the corresponding memory dies being programmed in the initial programming phase while a second sub-set of one or more of the corresponding memory dies being programmed in the fine programming phase can be illustrated with respect to FIGS. 19 and 21-23.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

We claim:

1. A non-volatile memory device, comprising:
a plurality of control circuits each configured to connect to a plurality of non-volatile memory cells of a corresponding memory die, each of the control circuits comprising a corresponding plurality of sets of data latches configured to store data to be written to and data read from the non-volatile memory cells of the corresponding memory die, each of the control circuits configured to:
perform a folding operation of pages of host data previously written in binary format in the memory cells of the corresponding memory die to be written in an N bit per cell format in the memory cells of the corresponding memory die, where, to perform the folding operation, each of the control circuits is configured to:
read out and store in the corresponding plurality of sets of data latches N pages of the host data previously written in the binary format in the memory cells of the corresponding memory die; and
write the N pages of the host data previously written in the memory cells of the corresponding memory die in a binary format into memory cells of the corresponding memory die in the N bit per cell format in a two phase programming operation in which the memory cells are programmed into an intermediate set of distributions in an initial programming phase and subsequently programmed into the N bit per cell format in a fine programming phase,
where the plurality of control circuits are configured to perform the folding operation on the plurality of corresponding memory die concurrently, a first sub-set of one or more of the control circuits performing the initial programming phase while a second sub-set of one or more control circuits are performing the fine programming phase.

2. The non-volatile memory device of claim 1, wherein when writing the N pages of the host data previously written in binary format into memory cells of the corresponding memory die in the N bit per cell format in the two phase programming operation, the corresponding sets of data latches are sequentially released in both of the initial programming phase and the fine programming phase, and each of the plurality of control circuits are further configured to:
receive the pages of host data;
store the received pages of host data in one of the corresponding sets of data latches;
write the pages of host data stored in the one of the corresponding set of data latches into memory cells of the corresponding memory die in a binary format; and
receive and store, during both of the initial programming phase and the fine programming phase, the received pages of host data in the one of the corresponding sets of data latches once the one of the corresponding sets of data latches are released.

3. The non-volatile memory device of claim 2, wherein at least a portion of an interval in which one of the first sub-set and the second sub-set of the control circuits is configured to receive and store pages of host data in the fine programming phase are non-overlapping with at least a portion of an interval in which another of the first sub-set and the second sub-set of the control circuits is configured to receive and store pages of host data in the initial programming phase.

4. The non-volatile memory device of claim 3, wherein at least a portion of the intervals in which the first sub-set and the second sub-set of the control circuits are further configured to:
receive and store pages of host data in the fine programming phase is non-overlapping with at least a portion of the interval in which the another of the first sub-set and the second sub-set of the control circuits is configured to receive and store pages of host data in the initial programming phase.

5. The non-volatile memory device of claim 2, wherein, subsequent to receiving and storing, during both of the initial programming phase and the fine programming phase, the received pages of host data in the one of the corresponding sets of data latches, suspending the corresponding programming phase to write the received pages of host data into the memory cells of the corresponding memory die in the binary format the plurality of control circuits are further configured to:
receive and store, during both of the initial programming phase and the fine programming phase, the received pages of host data in the one of the corresponding sets of data latches once the one of the corresponding sets of data latches are released.

6. The non-volatile memory device of claim 1, wherein each of the plurality of control circuits is on a control die and the corresponding memory die is on a separate memory die bonded to the corresponding control die.

7. The non-volatile memory device of claim 1, wherein the initial programming phase is a foggy programming operation.

8. The non-volatile memory device of claim 1, wherein the initial programming phase is a multi-state programming operation in which the memory cells are programmed into an M bit per cell format, and where 1<M<N.

9. The non-volatile memory device of claim 1, wherein N=4.

10. The non-volatile memory device of claim 1, wherein each of the control circuits is on the corresponding memory die.

11. The non-volatile memory device of claim 1, wherein the non-volatile memory device is a solid state drive.

12. The non-volatile memory device of claim 1, further comprising:
a non-volatile memory controller configured to transfer the pages of host data to the pages of host data to the plurality of control circuits, the non-volatile memory controller configured to manage the plurality of control circuits in parallel.

13. A method, comprising:
receiving, at each of a plurality control circuits for a corresponding memory die, pages of host data from a non-volatile memory controller managing the plurality of control circuits in parallel, each of the memory dies comprising a plurality of non-volatile memory cells and each of the control circuits comprising a corresponding plurality of sets of data latches configured to store data to be written to and data read from the non-volatile memory cells of the corresponding memory die;
storing the received pages of host data in one of the corresponding sets of data latches of each of the control circuits;

writing the pages of host data stored in the one of the corresponding set of data latches into memory cells of the corresponding memory die in a binary format;

reading out and storing in the corresponding plurality of sets of data latches N pages of the host data previously written in the binary format in the memory cells of the corresponding memory die; and concurrently writing into the memory cells of the plurality of memory dies the N pages of the host data previously written in binary format into memory cells stored in the corresponding plurality of sets of data latches in an N bit per cell format in a two phase programming operation comprising:

an initial programming phase in which the memory cells are programmed into an intermediate set of distributions; and a fine programming phase in which are programmed into the N bit per cell format, a first sub-set of one or more of the memory dies being written in the initial programming phase while a second sub-set of one or more memory dies are being written in the fine programming phase.

14. The method of claim 13, wherein when writing the N pages of the host data previously written in binary format into memory cells of the corresponding memory die in the N bit per cell format in the two phase programming operation, the corresponding sets of data latches are sequentially released in both of the initial programming phase and the fine programming phase, the method further comprising:

receiving and storing, during both of the initial programming phase and the fine programming phase, the received pages of host data in the one of the corresponding sets of data latches once the one of the corresponding sets of data latches are released.

15. The method of claim 14, wherein at least a portion of an interval in which one of the first sub-set and the second sub-set of the memory dies receive and store pages of host data in the fine programming phase is non-overlapping with at least a portion of an interval in which another of the first sub-set and the second sub-set of the memory dies is configured to receive and store pages of host data in the initial programming phase.

16. The method of claim 15, wherein during at portion of the intervals in which the first sub-set and the second sub-set of the method further comprises:

receiving and storing pages of host data in the fine programming phase is non-overlapping with at least a portion of the interval in which the another of the first sub-set and the second sub-set of the memory dies receive and store pages of host data in the initial programming phase.

17. The method of claim 14, wherein subsequent to receiving and storing, during both of the initial programming phase and the fine programming phase, the received pages of host data in the one of the corresponding sets of data latches, the method further comprises:

suspending the corresponding programming phase to write the received pages of host data into the memory cells of the corresponding memory die in the binary format; and receiving and storing, during both of the initial programming phase and the fine programming phase, the received pages of host data in the one of the corresponding sets of data latches once the one of the corresponding sets of data latches are released.

18. The method of claim 13, wherein the initial programming phase is a foggy programming operation.

19. The method of claim 13, wherein the initial programming phase is a multi-state programming operation in which the memory cells are programmed into an M bit per cell format, and where 1<M<N.

20. A non-volatile memory device, comprising:

a plurality of memory dies each comprising a plurality of non-volatile memory cells;

means for receiving and writing pages of host data into the memory cells of each of the corresponding memory dies in a binary format;

means for reading out and latching N pages of the host data previously written in the binary format in the memory cells of each of the corresponding memory dies; and means for concurrently writing the latched N pages of the host data previously written in binary format into memory cells of each of the corresponding plurality of memory dies in a N bit per cell format in a two phase programming operation in which the memory cells are programmed into an intermediate set of distributions in an initial programming phase and subsequently programmed into the N bit per cell format in a fine programming phase, a first sub-set of one or more of the corresponding memory dies being programmed in the initial programming phase while a second sub-set of one or more of the corresponding memory dies being programmed in the fine programming phase.

* * * * *